United States Patent
Shimooka et al.

(10) Patent No.: US 9,920,244 B2
(45) Date of Patent: Mar. 20, 2018

(54) NITRIDE PHOSPHOR AND METHOD FOR PRODUCING THE SAME

(71) Applicant: MITSUBISHI CHEMICAL CORPORATION, Tokyo (JP)

(72) Inventors: Satoshi Shimooka, Kanagawa (JP); Akihiro Ohto, Kanagawa (JP); Shiho Takashina, Kanagawa (JP)

(73) Assignee: MITSUBISHI CHEMICAL CORPORATION, Tokyo (JP)

( * ) Notice: Subject to any disclaimer, the term of this patent is extended or adjusted under 35 U.S.C. 154(b) by 151 days.

(21) Appl. No.: 14/821,068

(22) Filed: Aug. 7, 2015

(65) Prior Publication Data

US 2016/0040063 A1 Feb. 11, 2016

Related U.S. Application Data

(63) Continuation of application No. PCT/JP2014/052797, filed on Feb. 6, 2014.

(30) Foreign Application Priority Data

Feb. 7, 2013 (JP) ................. 2013-022444

(51) Int. Cl.
| | |
|---|---|
| C09K 11/79 | (2006.01) |
| C09K 11/77 | (2006.01) |
| H01L 33/50 | (2010.01) |
| C09K 11/08 | (2006.01) |
| F21K 9/64 | (2016.01) |

(52) U.S. Cl.
CPC ...... *C09K 11/7774* (2013.01); *C09K 11/0883* (2013.01); *C09K 11/7715* (2013.01); *C09K 11/7728* (2013.01); *F21K 9/64* (2016.08); *H01L 33/502* (2013.01); *H01L 33/507* (2013.01); *H01L 2224/48091* (2013.01); *H01L 2224/48247* (2013.01); *H01L 2924/181* (2013.01)

(58) Field of Classification Search
CPC ... C09K 11/7774; C09K 11/0883; F21K 9/64; H01L 33/502; H01L 33/507
See application file for complete search history.

(56) References Cited

U.S. PATENT DOCUMENTS

| | | |
|---|---|---|
| 2003/0094893 A1 | 5/2003 | Ellens et al. |
| 2008/0258602 A1 | 10/2008 | Masuda et al. |
| 2010/0085728 A1 | 4/2010 | Seto et al. |
| 2012/0256533 A1 | 10/2012 | Seto et al. |
| 2013/0234588 A1 | 9/2013 | Seto et al. |
| 2014/0042898 A1 | 2/2014 | Seto et al. |
| 2014/0139101 A1 | 5/2014 | Masuda et al. |
| 2014/0246623 A1 | 9/2014 | Takashina et al. |

FOREIGN PATENT DOCUMENTS

| | | |
|---|---|---|
| CN | 101663372 A | 3/2010 |
| CN | 102361956 A | 2/2012 |
| JP | 2003-206481 | 7/2003 |
| JP | 2005-272486 | 10/2005 |
| JP | 2008-088362 | 4/2008 |
| JP | 2008-127547 | 6/2008 |
| JP | 2009-249445 | 10/2009 |
| JP | 2010-084151 | 4/2010 |
| JP | 2010-095728 | 4/2010 |
| WO | 2008-132954 A1 | 11/2008 |
| WO | 2010-114061 A1 | 10/2010 |
| WO | 2013-073598 A1 | 5/2013 |

OTHER PUBLICATIONS

Combined Chinese Office Action and Search Report dated Jul. 26, 2016 in Patent Application No. 201480007758.6 (with English language translation).
International Search Report dated Jan. 18, 2014, in PCT/JP2014/0527975 filed Feb. 6, 2014 with English translation.
Office Action dated May 22, 2017 in Chinese Patent Application No. 201480007758.6 with English translation.
Decision on Rejection dated Nov. 6, 2017, in Chinese Patent Application No. 201480007758.6 filed Feb. 6, 2014 (with English translation).

*Primary Examiner* — C Melissa Koslow

(74) *Attorney, Agent, or Firm* — Oblon, McClelland, Maier & Neustadt, L.L.P.

(57) ABSTRACT

The present invention related to a nitride phosphor represented by the following general formula (1), the nitride phosphor having an x value of less than 0.43 in luminescent color coordinates (x, y) upon being excited with excitation light of 455 nm, and a reflectance Ra of 89% or more at 770 nm;

$$Ln_xSi_yN_n:Z \qquad (1),$$

wherein Ln is a rare-earth element excluding the element used as an activator, Z is an activator, x satisfies $2.7 \le x \le 3.3$, y satisfies $5.4 \le y \le 6.6$, and n satisfies $10 \le n \le 12$.

17 Claims, 12 Drawing Sheets

[FIG. 1]
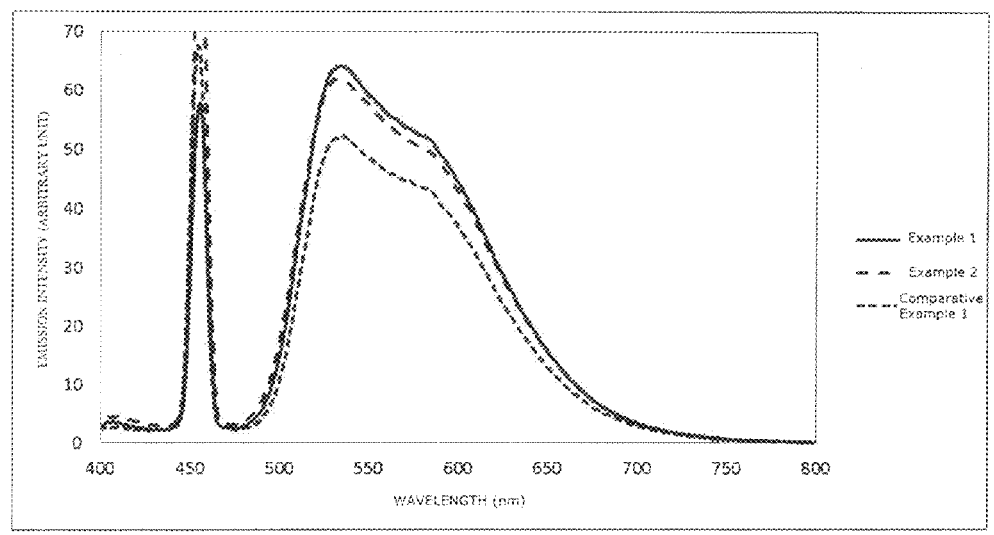
[FIG. 2]
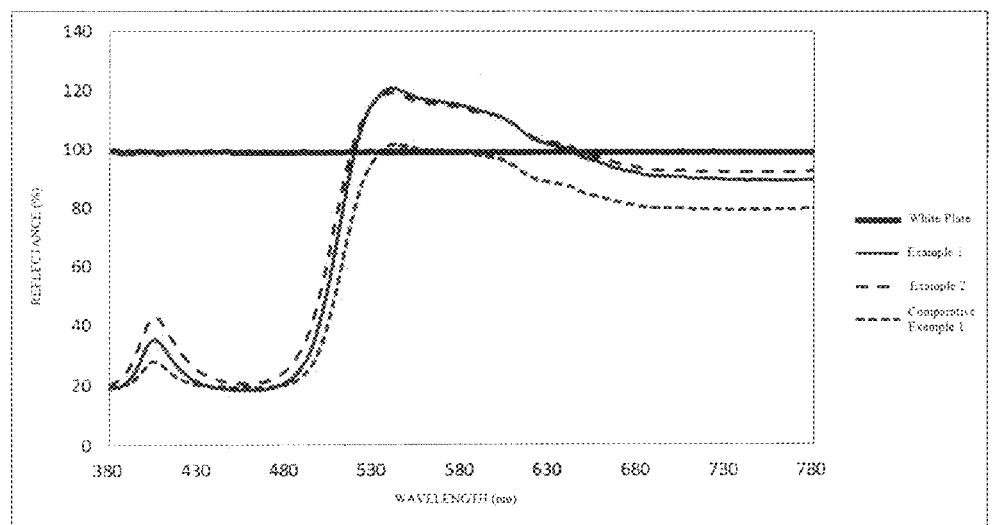

[FIG. 3]
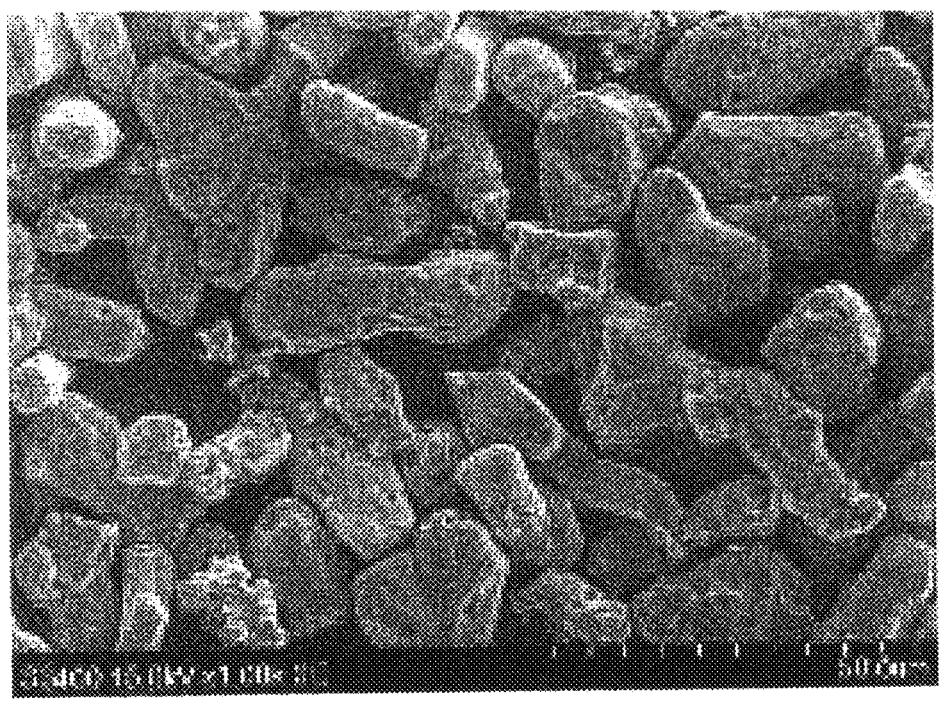

[FIG. 4]

[FIG. 5]
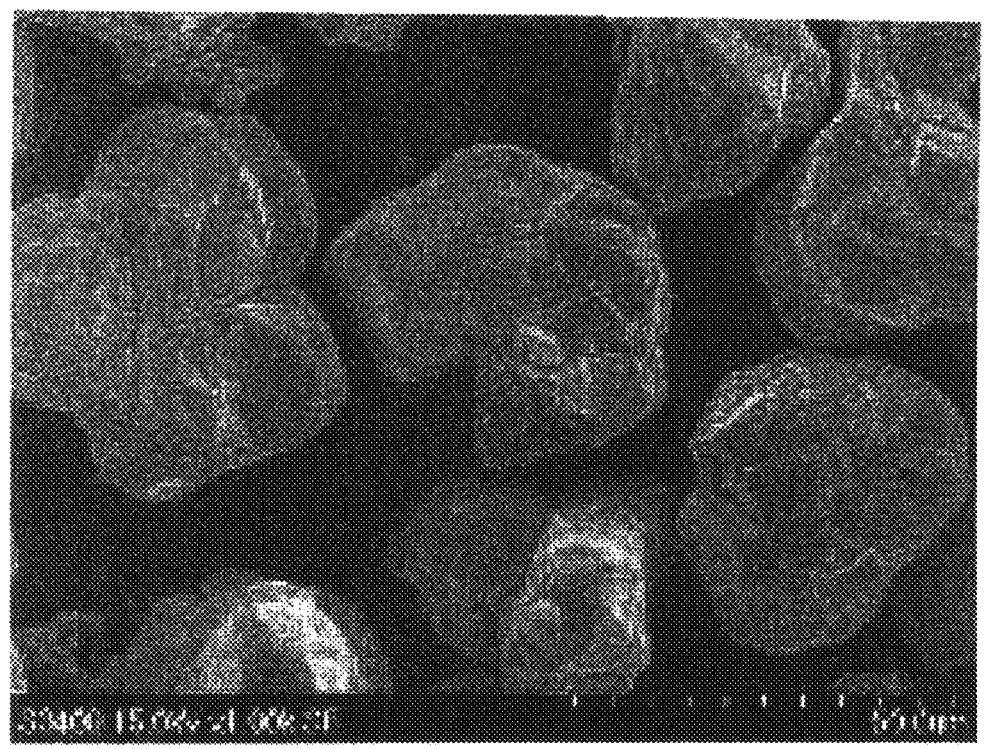

[FIG. 6]
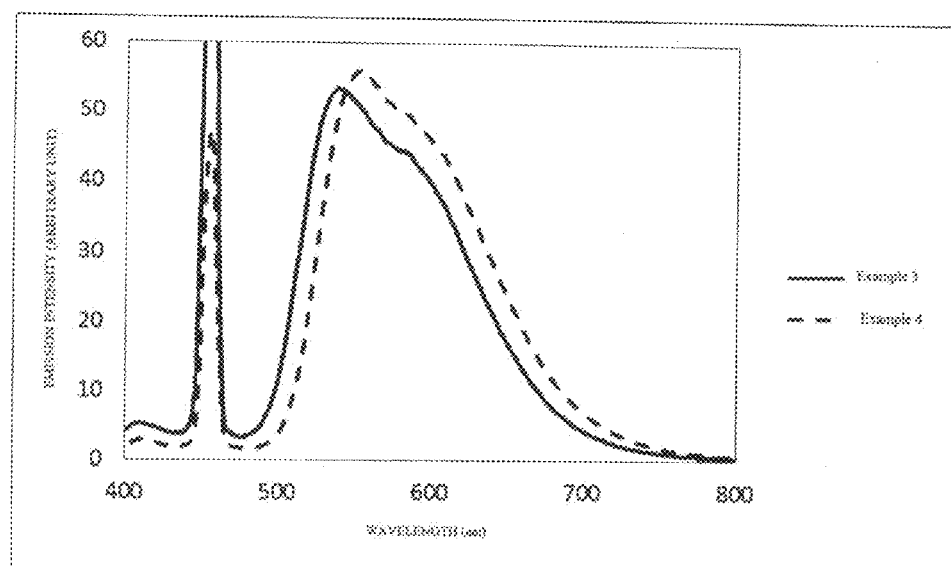
[FIG. 7]
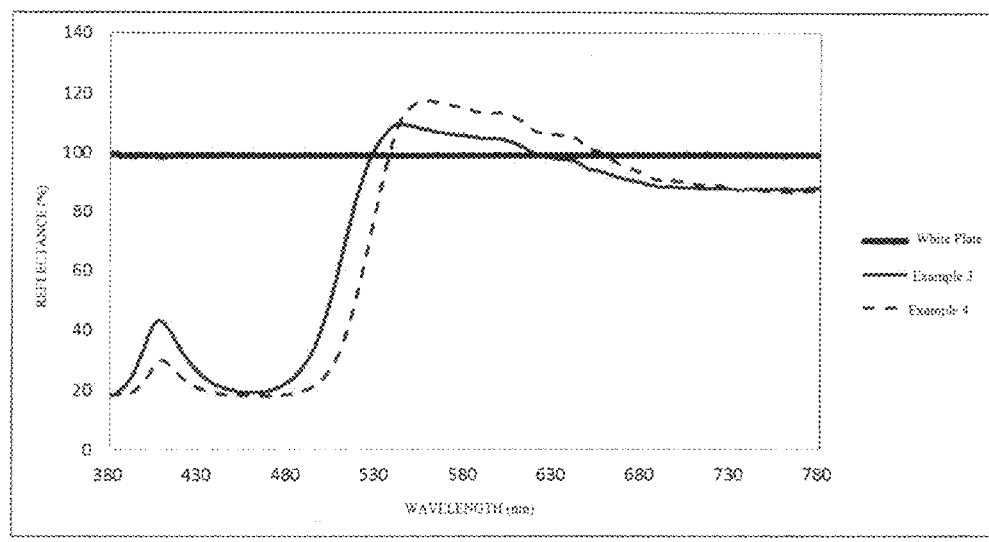

[FIG. 8]
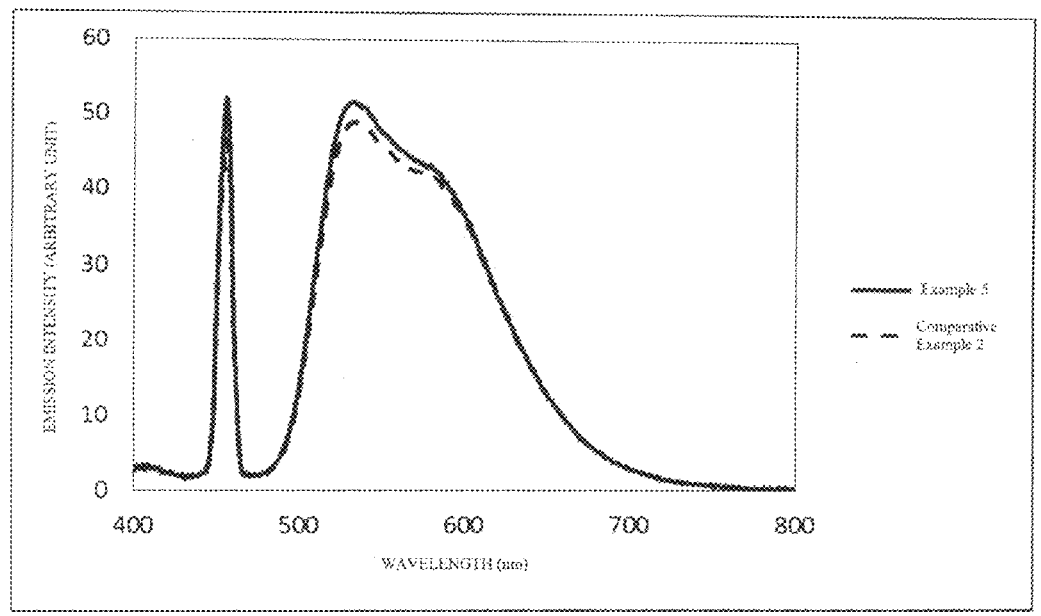

[FIG. 9]
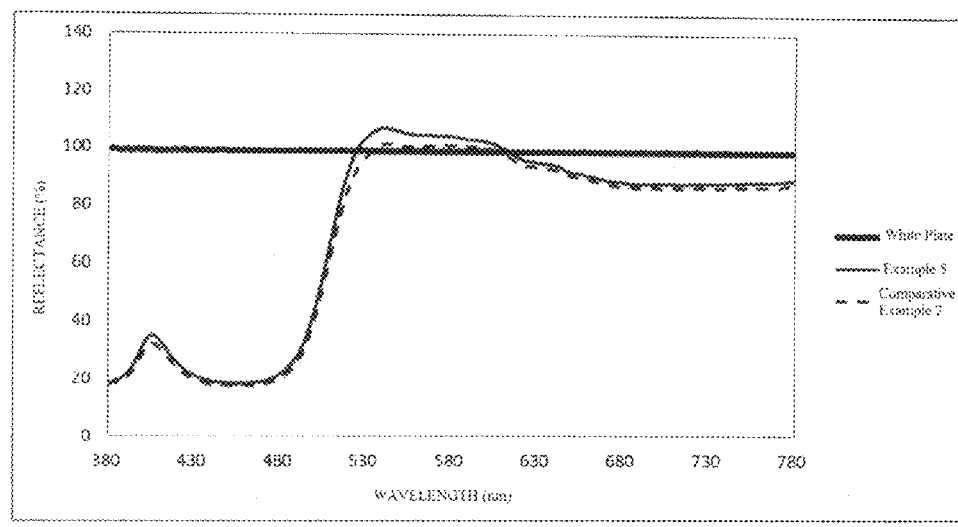
[FIG. 10]
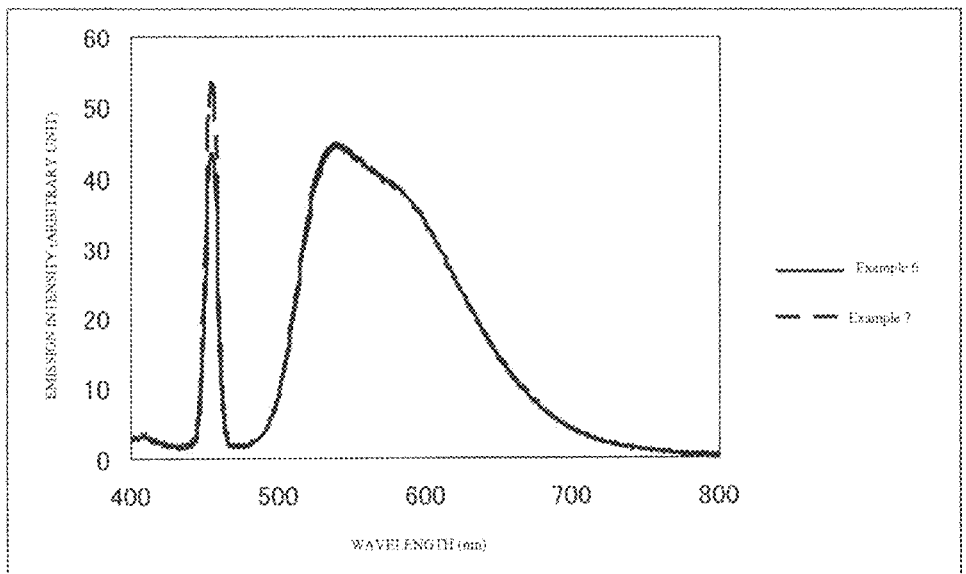

[FIG. 11]
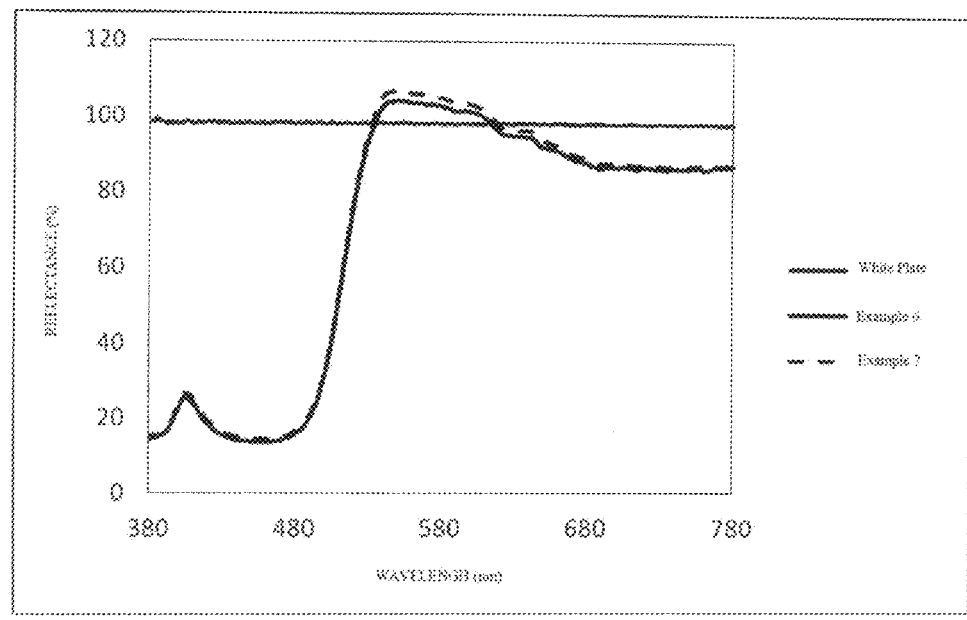
[FIG. 12]
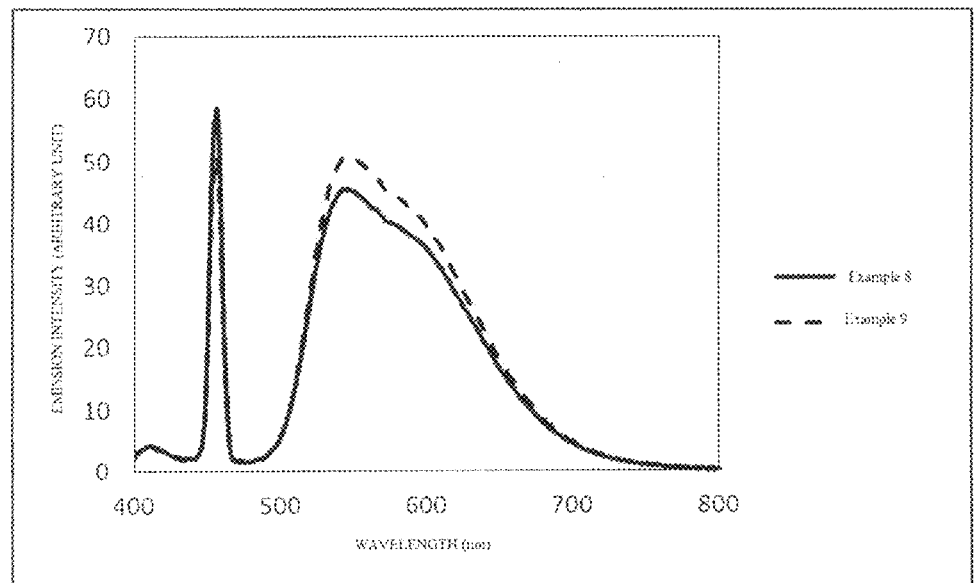

[FIG. 13]
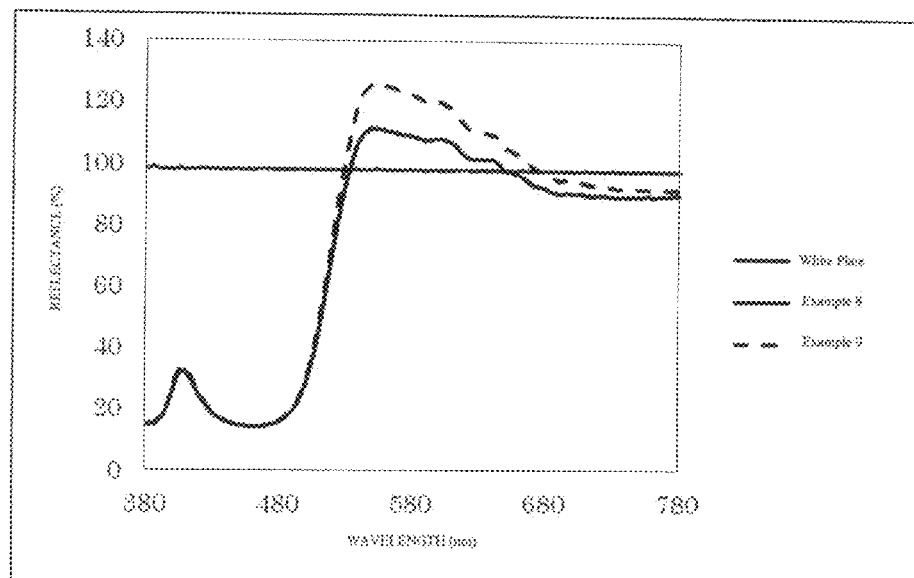
[FIG. 14]
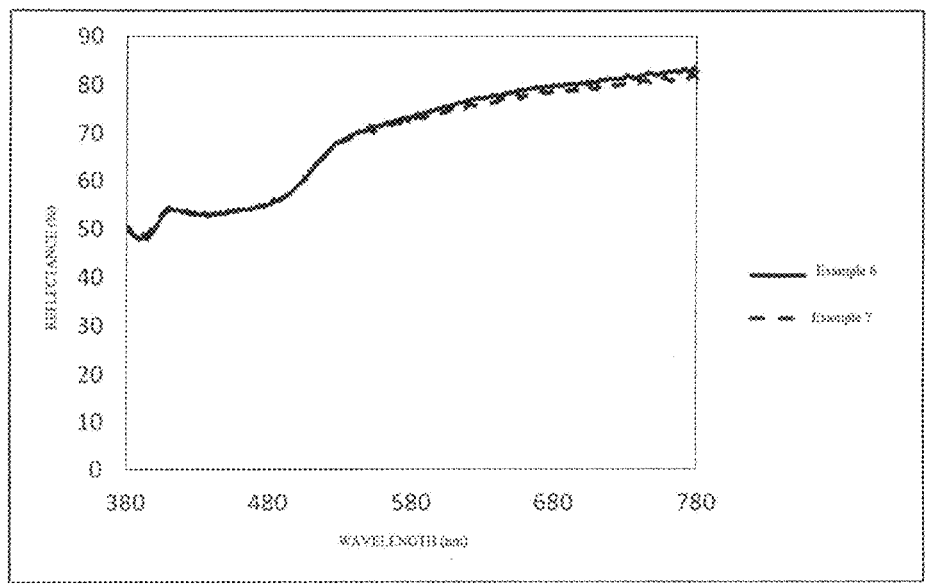

[FIG. 15]
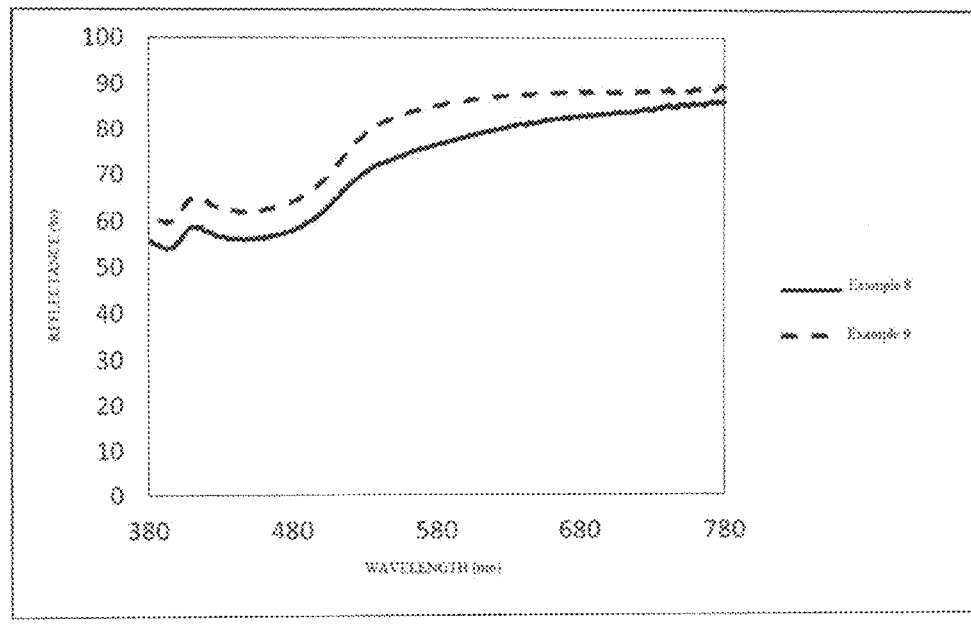
[FIG. 16]
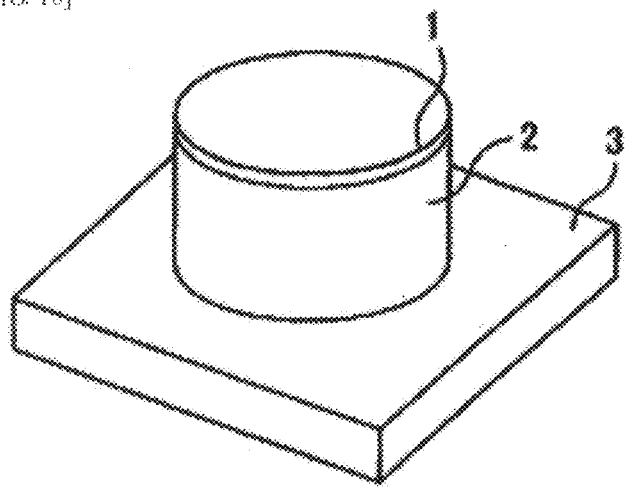

[FIG. 17A]
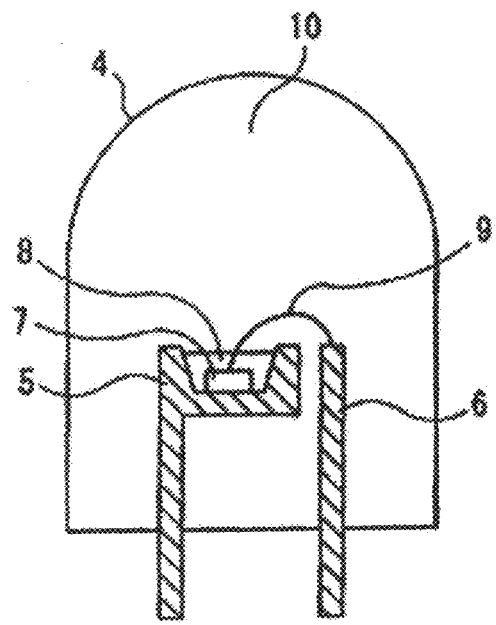
[FIG. 17B]
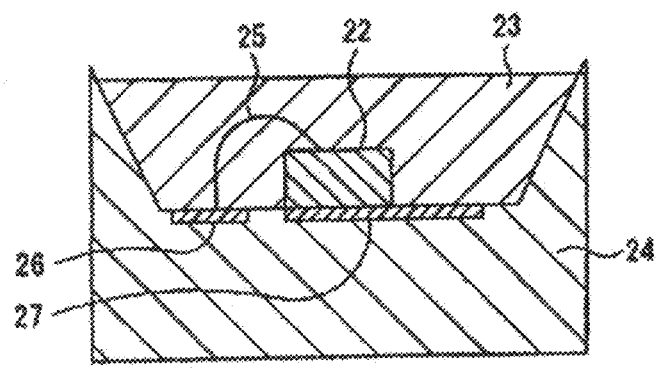

[FIG. 18]
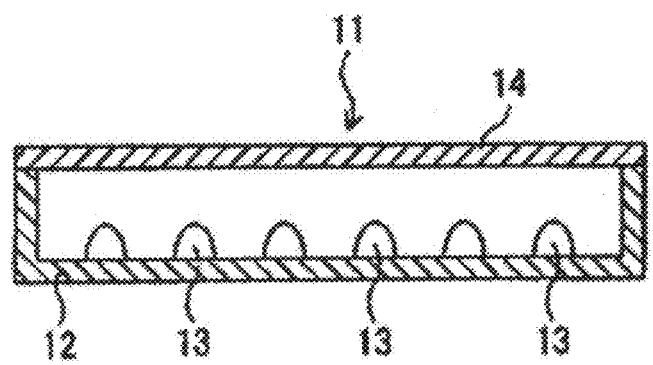

NITRIDE PHOSPHOR AND METHOD FOR PRODUCING THE SAME

TECHNICAL FIELD

The present invention relates to a nitride phosphor, a liquid medium containing the nitride phosphor, a light-emitting unit that includes the nitride phosphor, and a lighting device that includes the light-emitting unit.

BACKGROUND ART

With the recent trend for energy saving, there is an increasing demand for lightings and backlights that use LEDs. The LEDs used for these applications are white emitting LEDs of a construction in which a phosphor is disposed on an LED chip that emits light of blue or near ultraviolet wavelengths. Many of such white emitting LEDs use a YAG (yttrium-aluminum-garnet) phosphor that emits a yellow color by using the blue excitation light from a blue LED chip disposed underneath the YAG phosphor.

However, there are problems associated with the YAG phosphor. One problem is that temperature quenching, a phenomenon in which luminance decreases with increase in phosphor temperature, becomes high under high output conditions. Another problem is that luminance seriously degrades when the YAG phosphor is excited by near ultraviolet light (typically, the term "near ultraviolet light" used in conjunction with blue excitation is intended to be inclusive of a range covering purple of about 350 to 420 nm wavelengths) to improve color reproduction range and color rendering properties.

These problems have been addressed by studies of yellow emitting nitride phosphors. Most promising among such nitride phosphors are, for example, the $La_3Si_6N_{11}$ phosphors (hereinafter, these types of phosphors will be collectively referred to as "LSN phosphors", including those in which lanthanum is replaced with other metals) described in Patent Literatures 1 and 2. These publications describe producing LSN phosphors with a variety of fluxes (see paragraph [0248] of Patent Literature 1, and paragraphs [0131] to [0136] of Patent Literature 2).

CITATION LIST

Patent Literature

PTL 1: WO2008/132954
PTL 2: WO2010/114061

SUMMARY OF INVENTION

Technical Problem

The LSN phosphors described in Patent Literatures 1 and 2 involve less luminance degradation under high temperatures than conventional YAG phosphors, and are sufficiently emissive even with excitation by near ultraviolet light. However, the increasing demand for improved energy efficiency has created a need for phosphors that can produce higher emission luminance with less excitation energy.

The present invention has been made in view of these problems, and it is an object of the invention to provide a nitride phosphor of improved emission luminance, specifically a nitride phosphor having improved emission peak intensity, and a liquid medium containing such a nitride phosphor. The present invention is also intended to provide a light-emitting unit having improved emission luminance, and a high-quality lighting device.

Solution to Problem

After intensive studies, the present inventors found that the nitride phosphor of the present invention was less somber than the LSN phosphors of related art. As used herein, a phosphor being "somber" means that the body color of the phosphor appears slightly grayish in a phosphor powder visually observed under natural light without being excited.

The present inventors focused on this "somberness" of phosphor, and found that it can be specified by reflectance at specific wavelengths, and used as an index for specifying nitride phosphors of high emission luminance. The present invention was completed on the basis of this finding.

Specifically, the gist of the present invention resides in the following.

1. A nitride phosphor represented by the following general formula (1), the nitride phosphor having an x value of less than 0.43 in luminescent color coordinates (x, y) upon being excited with excitation light of 455 nm, and a reflectance Ra of 89% or more at 770 nm $$Ln_xSi_yN_n:Z \quad (1),$$

wherein:
Ln is a rare-earth element excluding the element used as an activator,
Z is an activator,
x satisfies $2.7 \leq x \leq 3.3$,
y satisfies $5.4 \leq y \leq 6.6$, and
n satisfies $10 \leq n \leq 12$.

2. A nitride phosphor represented by the following general formula (1), the nitride phosphor having an x value of 0.43 or more in luminescent color coordinates (x, y) upon being excited with excitation light of 455 nm, and a reflectance Ra of 87% or more at 770 nm, $$Ln_xSi_yN_n:Z \quad (1),$$

wherein:
Ln is a rare-earth element excluding the element used as an activator,
Z is an activator,
x satisfies $2.7 \leq x \leq 3.3$,
y satisfies $5.4 \leq y \leq 6.6$, and
n satisfies $10 \leq n \leq 12$.

3. A phosphor-containing composition comprising the nitride phosphor of the item 1 or 2 above, and a liquid medium.

4. A light-emitting unit comprising a first illuminant, and a second illuminant that emits visible light upon exposure to light from the first illuminant,
wherein the second illuminant contains one or more of the nitride phosphor of the item 1 or 2 above as a first phosphor.

5. An image display device comprising the light-emitting unit of the item 4 above as a light source.

6. A lighting device comprising the light-emitting unit of the item 4 above as a light source.

7. A method for producing a nitride phosphor represented by the following general formula (1)

$$Ln_xSi_yN_n:Z \quad (1),$$

wherein:
Ln is a rare-earth element excluding the element used as an activator,
Z is an activator, x satisfies 2.7≤x≤3.3,
y satisfies 5.4≤y≤6.6, and
n satisfies 10≤n≤12,
the method comprising a plurality of sintering steps that includes a first sintering step in which a sintering temperature is from 1100° C. to 1400° C., and a second sintering step in which source materials after the first sintering are redispersed, and subjected to a secondary sintering at a temperature between the first sintering temperature and 1800° C.

Advantageous Effects of Invention

The present invention enables providing a nitride phosphor of improved emission luminance, specifically a nitride phosphor having improved emission peak intensity, and a liquid medium containing such a nitride phosphor. The present invention also can provide a light-emitting unit having improved emission luminance, and a high-quality lighting device.

BRIEF DESCRIPTION OF DRAWINGS

FIG. 1 is a diagram comparing the emission spectra of phosphors obtained in Examples 1 and 2, and Comparative Example 1.

FIG. 2 is a diagram comparing the reflection spectra (A) of phosphors obtained in Examples 1 and 2, and Comparative Example 1.

FIG. 3 shows a SEM image, explaining the state of phosphor particles obtained in Example 1.

FIG. 4 shows a SEM image, explaining the state of phosphor particles obtained in Example 2.

FIG. 5 shows a SEM image, explaining the state of phosphor particles obtained in Comparative Example 1.

FIG. 6 is a diagram comparing the emission spectra of phosphors obtained in Examples 3 and 4.

FIG. 7 is a diagram comparing the reflection spectra (A) of phosphors obtained in Examples 3 and 4.

FIG. 8 is a diagram comparing the emission spectra of phosphors obtained in Example 5 and Comparative Example 2.

FIG. 9 is a diagram comparing the reflection spectra (A) of phosphors obtained in Example 5 and Comparative Example 2.

FIG. 10 is a diagram representing the emission spectra of phosphors obtained in Examples 6 and 7.

FIG. 11 is a diagram representing the reflection spectra (A) of phosphors obtained in Examples 6 and 7.

FIG. 12 is a diagram representing the emission spectra of phosphors obtained in Examples 8 and 9.

FIG. 13 is a diagram representing the reflection spectra (A) of phosphors obtained in Examples 8 and 9.

FIG. 14 is a diagram representing the reflection spectra (B) of phosphors obtained in Examples 6 and 7.

FIG. 15 is a diagram representing the reflection spectra (B) of phosphors obtained in Examples 8 and 9.

FIG. 16 is a schematic perspective view of an example of a light-emitting unit of the present invention, representing the positional relationship between a first illuminant provided as an excitation light source, and a second illuminant configured as a phosphor-containing portion with phosphors.

FIG. 17A is a diagram representing a light-emitting unit of a form commonly called a shell-type, and FIG. 17B is a diagram representing a light-emitting unit of a form called a surface-mounted type.

FIG. 18 is a diagram representing a surface-emitting lighting device with light-emitting units incorporated therein.

DESCRIPTION OF EMBODIMENTS

Embodiments of the present invention are described below in detail. It should be noted, however, that the present invention is not limited by the following embodiments, and may be implemented in various modifications within the scope of the invention.
(Types of Phosphors)

The phosphor of the present invention is a nitride phosphor represented by the following general formula (1).

$$Ln_xSi_yN_n:Z \quad (1)$$

[In the general formula (1),
Ln is a rare-earth element excluding the element used as an activator,
Z is an activator,
x satisfies 2.7≤x≤3.3,
y satisfies 5.4≤y≤6.6, and
n satisfies 10≤n≤12.]

The symbol Z in general formula (1) represents an activator. Examples of the activator include europium (Eu), cerium (Ce), chromium (Cr), manganese (Mn), iron (Fe), praseodymium (Pr), neodymium (Nd), samarium (Sm), terbium (Tb), dysprosium (Dy), holmium (Ho), erbium (Er), thulium (Tm), and ytterbium (Yb).

Preferably, Z contains Eu or Ce. More preferably, Z contains Ce in 80 mol % or more, further preferably 95 mol % or more of the total activator. Most preferably, Ce is contained alone.

The symbol Ln in general formula (1) is a rare-earth element excluding the element used as an activator. Examples of rare-earth elements for Ln include lanthanum (La), yttrium (Y), and gadolinium (Gd).

Ln preferably contains La. Preferably, La is contained in 80 mol % or more, preferably 95 mol % or more of the total Ln. Most preferably, La is contained alone.

A nitride phosphor that contains La alone tends to have a luminescent color coordinate x of less than 0.43. A nitride phosphor in which Ln contains Y or Gd in addition to La becomes a phosphor with a luminescent color coordinate x of 0.43 or more. Specifically, Y and Gd have ion radii close to that of La, and the charges are the same. These properties are preferable in terms of varying the luminescent color coordinate x with only small effects on the emission luminance of the product phosphor.

Aside from using Y or Gd with La for Ln, Ln may be partially substituted with elements such as calcium (Ca) and strontium (Sr) to make the luminescent color coordinate x 0.43 or more.

The concentration of the activator in the nitride phosphor of the present invention is typically 0.001 mol % or more, more preferably 0.01 mol % or more, further preferably 0.1 mol % or more, and is typically 50 mol % or less, more preferably 30 mol % or less, further preferably 15 mol % or less with respect to Ln.

Concentration quenching is unlikely to occur, and a heterophase of a chemical composition different from the phosphor of the present invention does not easily generate in these concentration ranges, and these ranges are preferable in terms of providing desirable luminescence characteristics.

The subscripts x, y, and n in general formula (1) set the molar ratio of the elements, as follows. The element molar ratio (x:y:n) in general formula (1) is 3:6:11 in terms of a stoichiometric composition. In practice, however, deficiency and excess occurs because of such factors as depletion due to oxygen, and charge compensation. The acceptable range of such deficiency and excess is typically a little over 10 percent, preferably about 10 percent. The phosphor is usable as long as deficiency and excess falls in these ranges.

Specifically, x is a value that typically satisfies $2.5 \leq x \leq 3.5$. The lower limit is preferably 2.7, further preferably 2.9. The upper limit is preferably 3.3, further preferably 3.1. The subscript y is a value that typically satisfies $5.4 \leq y \leq 6.6$. The lower limit is preferably 5.7, and the upper limit is preferably 6.3. The subscript n is a value that typically satisfies $10 \leq c \leq 12$. The lower limit is preferably 10.5, and the upper limit is preferably 11.5.

The phosphor of the present invention obeys the law of conservation of charge, and is subject to substitution by other elements at the same time. Substitution may replace some of the Si or N sites with oxygen or other elements, and such phosphors are also preferable for use in the present invention.

The phosphor composition, as a whole, may contain minute amounts of impurities such as oxygen through partial oxidation or halogenation, as long as the effects of the present invention are obtained. The phosphors represented by general formula (1) may have any oxygen/(oxygen+ nitrogen) proportions (molar ratio), as long as the phosphor of general formula (1) of the present invention is obtained. The oxygen/(oxygen+nitrogen) molar ratio is typically 5% or less, preferably 1% or less, more preferably 0.5% or less, further preferably 0.3% or less, particularly preferably 0.2% or less.

(Particle Size of Phosphor)

The phosphor of the present invention has a volume median size of typically 0.1 μm or more, preferably 0.5 μm or more, and typically 35 μm or less, preferably 25 μm or less.

These lower limits are preferable in terms of providing desirable emission luminance in the product phosphor, and preventing aggregation of phosphor particles. The foregoing upper limits are preferable in terms of preventing non-uniform coating, or clogging of a dispenser or the like.

Volume median size may be measured by using, for example, a Coulter counter method, with a device such as the Multisizer available from Beckman Coulter. The device is not limited to this, as long as the device can be used to perform the same measurements.

(Reflectance of the Phosphor of the Present Invention)

The phosphor reflectance may be measured by using the following reflectance measurement methods (A) and (B).

As will be described later, the reflectance measurement method (A) irradiates a sample (phosphor powder) with white light, and measures the intensity of reflected light after dispersing it on the detector side. The reflectance measured by using the reflectance measurement method (A) will be denoted as "Ra (%)".

On the other hand, in the reflectance measurement method (B), dispersed light (light of a specific wavelength) is incident on a sample, and the intensity of reflected light is measured. The reflectance measured by using the reflectance measurement method (B) will be denoted as "Rb (%)".

The nitride phosphor of the present invention is specified by its reflectance Ra measured at 770 nm. In the reflectance measurement method (A), a specific wavelength of 770 nm is selected for the measurement of the nitride phosphor of the present invention for the following reasons.

The nitride phosphor represented by general formula (1) has an excitation spectrum region between 300 nm and 520 nm, and an emission spectrum region between 480 nm and 760 nm. Here, measuring reflectance Ra at a wavelength of the excitation spectrum region means that the incident light is absorbed by the phosphor. This is not desirable in the present invention, which specifies the characteristics of the phosphor itself.

The reflectance Ra measured at a wavelength of the emission spectrum region contains an emissive component of the phosphor. Again, this is not desirable in the present invention in which the characteristics of the phosphor itself are specified. These are the reasons for selecting a 770 nm wavelength as the wavelength that does not affect the absorption or the emission by the phosphor, and enables the body color of the phosphor to be accurately specified.

The following describes the method (A) for measuring reflectance Ra, and the method (B) for measuring reflectance Rb. These measurement methods are based on JIS standard Z8722 and Z8717.

[Method (A) for Measuring Reflectance Ra: Dispersion of Reflected Light]

For the measurement of reflectance Ra, a 150-W xenon lamp is used as the excitation light source, an integrating sphere is used as a light-collecting device, and an MCPD7000 multi-channel spectrum measurement device (Otsuka Electronics) is used as a spectrum measurement device.

First, a material with nearly 100% reflectance R for the excitation light (the Labsphere product Spectralon with 99% reflectance R for 450 nm excitation light) is installed as a standard white reflector, and irradiated with light from the 150-W xenon lamp. The intensity of reflected light at each wavelength in a 380 nm to 780 nm wavelength range is then measured with the spectrum measurement device, and a reflection spectrum is obtained after signal processing such as sensitivity correction by a personal computer.

Thereafter, a phosphor powder to be measured is packed in a cell while making sure that the surface is sufficiently smooth to ensure measurement accuracy, and the intensity of reflected light is measured at each wavelength in the manner described above. A reflection spectrum of the sample is then obtained as percentages of the measured reflection intensities from the standard white reflector.

The devices used to measure reflectance Ra in the present invention are not limited to the devices exemplified above, and other measurement devices may be used, as long as these can be used to perform the same measurements. It is, however, preferable to use the measurement devices above.

The phosphor of the present invention has a reflectance Ra of 89% or more when the x value of luminescent color coordinates (x, y) upon being excited with 455 nm excitation light is less than 0.43. The reflectance Ra of the phosphor of the present invention is 87% or more when the x value of luminescent color coordinates (x, y) obtained upon excitation at 455 nm is 0.43 or more.

In the present invention, the x value 0.43 is used as a border line as above. This is because when the x value is less than 0.43, the emission occurs on the relatively shorter wavelengths side, and appears greenish. Such phosphors are usually preferable for use in mainly backlight applications.

When the x value is 0.43 or more, the emission occurs on the relatively longer wavelength side, and appears yellow to orange. Such phosphors are usually preferable for use in mainly lighting applications.

As described above, the preferred ranges as may be suited for different applications are specified by luminescent color coordinates and reflectance Ra in the present invention.

The significance of making evaluation with the x value of luminescent color coordinates is that the x coordinate, indicative of the whole emission, can more appropriately represent phosphor characteristics than emission peak wavelengths in dealing with emission of a relatively wide wavelength range such as in phosphors. Typically, the lower limit of x value is preferably 0.15 or more when x is less than 0.43, and the upper limit is preferably 0.6 or less when x is 0.43 or more. Typically, the y value preferably ranges from 0.3 to 0.7.

[Reflectance Measurement Method (B): Dispersed Incident Light]

A reflection spectrum is obtained with a visible to ultraviolet autographic spectrophotometer UV-3100PC (Shimadzu Corporation) equipped with a 50-W halogen lamp light source, and a light-collecting integrating sphere. Measurement is performed with a 2.0 nm slit width on the light source side, a 1 nm sampling interval, and a scan speed set on the middle setting.

First, standard white reflectors are set on the subject side and the sample side of a measurement holder in the integrating sphere unit of the spectrophotometer sample chamber, and samples on the subject side and the sample side are irradiated only with light of 380 nm to 780 nm wavelengths dispersed through a grating spectroscope. The intensity of reflected light is then measured, and used for baseline correction by signal processing such as sensitivity correction by a personal computer.

A phosphor powder to be measured is then charged into a fused quartz-equipped measurement cell, gently tapped, and set on a sample holder on the sample side after closing the cap. The intensity of reflected light is then measured as above, and a reflection spectrum of the sample is obtained as percentages of the reflection intensities from the standard white reflector.

The devices used to measure reflectance Rb in the present invention are not limited to the devices exemplified above, and other measurement devices may be used, as long as these can be used to perform the same measurements. It is, however, preferable to use the measurement devices above.

In the phosphor of the present invention, the ratio of reflectance Rb(EP) (%) at the emission peak wavelength to reflectance Rb(770) (%) at 770 nm is preferably 0.8 or more, more preferably 0.83 or more as measured by using the reflectance measurement method (B). These ranges are preferable from the viewpoint of more easily obtaining the effects of the present invention.

<Effectiveness>

A phosphor of high emission peak intensity is obtained with the configuration of the present invention. This appears to be due to the following reasons. The nitride phosphor of the present invention is less somber than conventional LSN phosphors. The following describes the unique mechanism by which such somberness occurs in LSN phosphors.

Production of LSN phosphors involves sintering in a nitrogen atmosphere after mixing source materials. Though sintering does not usually form LSN crystals, crystal growth tends to rapidly proceed once crystals are formed. Such rapid crystal growth tends to make the source materials deviate from the stoichiometric composition, and create inhomogeneities in phosphor crystals, or cause crystal defects.

Such inhomogeneities or defects in phosphor crystals are responsible for somberness. Specifically, by specifying the value of reflectance Ra at 770 nm in a specific range, the present invention specifies a nitride phosphor of improved qualities with fewer crystal inhomogeneities and crystal defects.

(Method for Producing Phosphor of the Present Invention)

The method for producing the phosphor of the present invention is not particularly limited, as long as it can produce the phosphor and the effects of the present invention. For example, a technique may be used that is based on an idea to control the rapid crystal growth. The idea for reducing rapid crystal growth may be, for example, a method that includes a plurality of sintering steps, and that redisperses the source materials between these sintering steps, and a method that uses phosphor source materials of high melting points.

In a preferred method for producing the phosphor of the present invention, the source materials are redispersed after a first sintering step performed at a sintering temperature of from 1100° C. to 1400° C., and subjected to a secondary sintering in a temperature range between the first sintering temperature and 1900° C.

(Source Materials)

The source materials (Ln source, Si source) used in the present invention may be, for example, metals, alloys, or compounds that contain the host constituent element Ln or Si of the phosphor, and, as required, elements added to adjust variables such as emission wavelengths, or the activator element Z.

Examples of the Ln source and Si source compounds include nitrides, oxides, hydroxides, carbonates, nitrates, sulfates, oxalates, carboxylates, and halides of the elements forming the phosphor. Specifically, these metallic compounds may be appropriately selected, taking into consideration factors such as reactivity to the target, and the levels of $NO_x$, $SO_x$, and other such compounds generated during the sintering process. However, considering that the phosphor of the present invention is a nitrogen-containing phosphor, it is preferable to use nitrides and/or oxynitrides. Use of nitrides is more preferred because nitrides also serve as the nitrogen source.

Specific examples of nitrides and oxynitrides include nitrides of phosphor constituent elements, such as LaN, $Si_3N_4$, and CeN, and composite nitrides of phosphor constituent elements, such as $La_3Si_6N_{11}$, and $LaSi_3N_5$.

The nitrides may contain trace amounts of oxygen. The proportions of oxygen/(oxygen+nitrogen) (molar ratio) in the nitride are not limited, as long as the phosphor of the present invention is obtained. Excluding the oxygen derived from the adsorbed moisture, it is preferable that the oxygen/(oxygen+nitrogen) molar ratio is typically 5% or less, preferably 1% or less, more preferably 0.5% or less, further preferably 0.3% or less, particularly preferably 0.2% or less. Luminance may degrade when the proportion of oxygen in the nitride is excessive.

Preferably, a phosphor host or a phosphor itself is used as a part of source materials. Having been reacted to become a phosphor host, these materials only contribute to growth, and are unlikely to generate reaction heat. In the event where other source materials start to run out of control in nitridation, a phosphor host or a phosphor also acts to stabilize the reaction and release heat. It is therefore preferable to add these materials in about 1 to 10% mass of the total source material.

When using oxygen-containing compounds such as oxides, it is preferable to remove oxygen by some means, for example, such as by means of superheating in an ammonia- or hydrogen-containing atmosphere in early stages of sintering, so as to prevent excess mixing of oxygen into the phosphor, particularly when these compounds are used in large amounts. The source materials above may be those described in Patent Literatures 1 and 2 (WO2008/132954, and WO2010/114061). Detailed descriptions of methods that use alloys, in particular, can be found in Patent Literature 2. Alloys may be used with a flux, an additive used as a growth promoter.

(Growth Promoter: Adding Fluxes)

Detailed descriptions of fluxes can be found in Patent Literatures 1 and 2, and the fluxes described in these publications may be used herein.

Specifically, non-limiting examples of fluxes include halogenated ammonium such as $NH_4Cl$ and $NH_4F \cdot HF$; alkali metal carbonates such as $Na_2CO_3$ and $Li_2CO_3$; alkali metal halides such as LiCl, NaCl, KCl, CsCl, LiF, NaF, KF, and CsF; alkali earth metal halides such as $CaCl_2$, $BaCl_2$, $SrCl_2$, $CaF_2$, $BaF_2$, $SrF_2$, $MgCl_2$, and $MgF_2$; alkali earth metal oxides such as BaO; boron oxide, boric acid, and boronate compounds of alkali metals or alkali earth metals, such as $B_2O_3$, $H_3BO_3$, and $Na_2B_4O_7$; phosphate compounds such as $Li_3PO_4$ and $NH_4H_2PO_4$; halogenated aluminum such as $AlF_3$; zinc compounds such as halogenated zinc (e.g., $ZnCl_2$, and $ZnF_2$), and zinc oxide; compounds of Group 15 elements of the periodic table, such as $Bi_2O_3$; and nitrides of alkali metals, alkali earth metals, or Group 13 elements, such as $Li_3N$, $Ca_3N_2$, $Sr_3N_2$, $Ba_3N_2$, and BN.

Other examples of fluxes include halides of rare-earth elements, such as $LaF_3$, $LaCl_3$, $GdF_3$, $GdCl_3$, $LuF_3$, $LuCl_3$, $YF_3$, $YCl_3$, $ScF_3$, and $ScCl_3$, and oxides of rare-earth elements, such as $La_2O_3$, $Gd_2O_3$, $Lu_2O_3$, $Y_2O_3$, and $Sc_2O_3$.

Preferred as fluxes are halides, specifically, for example, alkali metal halides, alkali earth metal halides, zinc halides, and halides of rare-earth elements. The halides are preferably fluorides and chlorides.

For deliquescent fluxes, it is preferable to use anhydrides. When more than one flux is used, two or more fluxes may be used in any combination and proportions. Particularly preferred as such other fluxes are, for example, $MgF_2$, $CeF_3$, $LaF_3$, $YF_3$, and $GdF_3$. Some fluxes, including $YF_3$ and $GdF_3$, have the effect to change the chromaticity coordinates (x, y) of the emitted color.

Fluxes containing halides of rubidium or cesium are preferred because these halides have large cation sizes, and are unlikely to be incorporated into the phosphor. These are not described in Patent Literatures 1 and 2. Use of an activator halide is also preferred because it can serve as both a source material and a flux. The flux is used in preferably 0.1 mass % to 20 mass % of the starting phosphor.

(Mixing Source Materials)

When using an alloy to produce the phosphor, the alloy may be sintered either alone, or, as required, with the flux, as long as the composition of the metallic elements contained in the alloy matches the composition of the metallic elements contained in the crystal phase represented by the foregoing formula (1).

On the other hand, when an alloy is not used for phosphor production, or the compositions do not match, the source material or the alloy used is sintered after being mixed with other materials, such as an alloy of a different composition, a simple substance metal, and a metallic compound, so that the composition of the metallic elements contained in the source material matches the composition of the metallic elements contained in the crystal phase represented by the foregoing formula (1).

In the phosphor of the present invention, the theoretical composition ratio of La, Si, and N is preferably 3:6:11. Given that compounds of a similar molar ratio 1:3:5 exist, the molar ratio of La or a La-site substituting element may preferably be increased to prevent generation of such compounds.

In this case, the molar ratio of La or a La-site substituting element may be varied to about 1:1.5 from the theoretical composition of 1:2. This varying of the composition ratio is particularly preferable when the source material has a high oxygen content.

A method that uses the source materials in excess of the stoichiometric composition to produce the phosphor of the present invention is also possible. For example, with an excess Ln source (La source or Y source), the excess Ln source discharges out of the crystal phase after the formation of the LSN crystal phase. This discharge of the Ln source from the crystals is accompanied by the heterophase that was formed in the reaction. This is believed to improve the crystal quality of the LSN crystal phase.

Mixing of the phosphor source materials may itself be performed by using a known technique. Particularly preferred as such techniques are a method in which the source materials are supplied into a pot with a solvent, and mixed by being crushed with balls, and a method that dry mixes the source materials, and passes the mixture through a mesh. When the source materials are dispersed and mixed in a solvent, the solvent must be removed, and, as required, the aggregates are broken down after drying the materials. These procedures are performed preferably in a nitrogen atmosphere.

When the phosphor of the present invention is produced in the multi-step sintering described below, it is preferable to add the flux before the step that uses the highest sintering temperature, and thoroughly mix the flux, for example, by passing it through a sieve.

(Sintering Step)

The source material mixture (hereinafter, also referred to as "phosphor precursor") obtained in the manner described above is typically charged into a container such as a crucible and a tray, and placed in an atmosphere controllable heating furnace. The container is preferably made of materials having low reactivity to metallic compounds. Examples of such materials include boron nitride, silicon nitride, carbon, aluminum nitride, molybdenum, and tungsten. Molybdenum and boron nitride are particularly preferred for their desirable corrosion resistance. These materials may be used either alone or in a combination of two or more in any proportions.

When sintering is performed in multiple steps as will be described later, the first sintering that generates a crystal nucleus and removes oxygen or the like involves relatively low temperatures, and offers more freedom in choosing the material of the crucible, allowing the crucible to be made of materials such as boron nitride, alumina, molybdenum, and tungsten, or use boron nitride with an inner paste such as molybdenum applied to inside of the crucible. It is, however, preferable to use a metallic crucible, particularly a tungsten or molybdenum crucible in the second sintering in which the phosphor is finally grown, because these materials can prevent inclusion of impurities, and can immediately remove the generated heat when a thermal runaway reaction occurs.

The phosphor of the present invention can be obtained upon sintering the source material mixture. Preferably, the source material mixture is sintered with the maintained volume packing fraction of 40% or less. The volume packing fraction can be determined by using the following math formula.

(Bulk density of mixed powder)/(theoretical density of mixed powder)×100[%]

The phosphor of the present invention can be produced by using methods known from Patent Literature 1 or 2, in combination with a technique that overcomes the inhomogeneity during sintering. For example, a method that uses a fluidized bed to constantly agitate the source materials, and a method that vibrates the crucible during sintering represent such a technique. Preferably, these are used to agitate the source materials during sintering.

Preferred as such a method is a method that uses a rotary kiln. The crucible cannot be easily turned up side down in the method that vibrates the crucible, and, under certain conditions, for example, a specific gravity difference in the source materials may become a factor that creates even more inhomogeneities.

With a rotary kiln, however, the source materials do not become separated, and are sufficiently agitated even when there is a specific gravity difference, particularly when a baffle plate or the like is provided inside the kiln. This makes it easier to obtain the phosphor of the present invention. Here, when a relatively small furnace is used, the rotation speed may be slower than the rotation speed that provides maximum efficiency in dispersing a pigment or the like. The effects of the present invention will still probably be obtained with a rotation speed as slow as about 2 rpm when the furnace has an inner diameter larger than 50 cm. With a rotary kiln, it is also possible to immediately remove the heat generated by thermal runaway in a nitridation reaction, making it easier to obtain the high reflectance phosphor of the present invention.

The most convenient method with the least investment is to sinter the source materials into the phosphor in multiple steps, with remixing of the materials during the sintering process. Specifically, the source materials are redispersed by means of agitation, more preferably by sieving. The method involves multiple sintering steps, and the furnace tends to be less productive. It is therefore most preferable to divide the sintering process into two steps, and redisperse the source materials after the first sintering, for example, by sieving.

In this case, the temperature of the first sintering is most preferably the temperature at which the phosphor host starts to generate, before nucleation takes place for crystal growth. Such a temperature is preferably 1100° C. to 1400° C., though it slightly varies with the type of the source materials used. The lower limit is preferably 1150° C. or more, most preferably 1250° C.

The temperature on the lower side of the foregoing range only needs to generate nuclei for crystal growth while preventing excess growth. Any decrease in lower limit temperature may thus be compensated by increasing the sintering time. On the other hand, it becomes difficult to appropriately control the first sintering time as the temperature increases above the foregoing upper limit. The upper limit temperature is thus 1400° C. or less, more preferably 1350° C. or less, most preferably 1300° C. or less.

The first sintering time is preferably 2 to 20 hours at 1200 to 1350° C., 4 to 10 hours at 1100 to 1200° C., and at most 5 hours at 1350° C. or more.

The sintering temperature program is such that the temperature is increased at a rate of preferably about 1 to 10° C./min to temperatures about 100° C. lower than the first sintering temperature, and the rate is changed to preferably 1 to 2° C./min upon the source materials being heated to a temperature within 100° C. below the target temperature. This is to prevent overheating of the source materials, and to maintain the stability of the first sintered product in which the reaction is thought to rapidly proceed. Example 1 describes sintering performed at 1250° C.

Preferably, sintering is performed in a nitrogen atmosphere or an ammonia atmosphere, more preferably in a mixed atmosphere of nitrogen with at most 10% hydrogen. Excess hydrogen amounts pose the risk of explosion, and the hydrogen content is most preferably 4% or less.

As described above, other components such as a flux are then added, as required, to the first sintered product so obtained. The mixture is then redispersed, for example, by using a mortar, or by being passed through a mesh to prevent aggregation due to heat, and to improve uniformity of the source materials and thereby prevent somberness. The product can then be evaluated by measuring reflectance at 770 nm as recited in the claims. This procedure is performed preferably in a nitrogen atmosphere or an inert atmosphere. The oxygen concentration in the atmosphere is controlled at preferably 1 vol % or less, particularly 100 ppm or less.

When using a mesh, the mesh opening is preferably 1 mm or less, more preferably 100 μm or less, though a mesh with larger openings serves the purpose to some extent. The resultant first sintered product is subjected to second sintering. Specifically, the first sintered product is packed into the crucible, and sintered in an atmosphere controllable furnace.

The second sintering may be performed under the temperature conditions described in Patent Literatures 1 and 2. Specifically, the second sintering temperature is preferably between the first sintering temperature and 1900° C., more preferably 1400° C. to 1700° C.

The sintering temperature pattern is such that the rate of temperature increase is preferably 1.5° C./min or less from 1150 to 1400° C., a temperature range suitably used when the source materials contain an alloy and in which the nitridation generates serious heat, preferably in at least a region of this temperature range in which an exothermic peak occurs.

Preferably, the upper limit of the rate of temperature increase is typically 1.5° C./min or less, preferably 0.5° C./min or less, more preferably 0.1° C./min or less. The lower limit is not particularly limited, and may be decided by considering the product economy for industrial production. As used herein, "exothermic peak" refers to an exothermic peak as determined by TG-DSC (thermogravimetry-differential scanning calorimetry).

The second sintering is performed by heating the phosphor source materials in an environment of hydrogen-containing nitrogen gas or under a stream of hydrogen-containing nitrogen gas. The pressure may be slightly lower than the atmospheric pressure, or may be the atmospheric pressure or an increased pressure. Preferably, the atmospheric pressure or higher pressures are used to prevent inclusion of oxygen from the atmosphere.

With a pressure below the atmospheric pressure, there is a possibility of entry of large amounts of oxygen into the source materials when the heating furnace is poorly sealed, and a high-quality phosphor may not obtained. The pressure of the hydrogen-containing nitrogen gas is preferably at least 0.1 MPa or more in terms of a gauge pressure. Alternatively, the source materials may be heated under a high pressure of 20 MPa or more. The pressure is preferably 200 MPa or less.

The system is then sufficiently displaced with a nitrogen-containing gas flown into the system. The gas may be flown after evacuating the system, as required.

The heating time in the second sintering (retention time at maximum temperature) is the time needed for the reaction of the phosphor source materials with nitrogen. Preferably, the heating time is typically 1 minute or more, preferably 10 minutes or more, more preferably 30 minutes or more, further preferably 60 minutes or more. When the heating time is shorter than 1 minute, the nitridation reaction may not proceed to completion, and a high-quality phosphor may not be obtained. The upper limit of heating time is decided in the light of production efficiency, and is typically 50 hours or less, preferably 24 hours or less.

For the second sintering, a sinter container charged with the phosphor source material mixture is placed in a heating furnace. Here, any sintering device may be used, as long as the effects of the present invention are obtained. Preferably, the device is adapted to enable controlling the atmosphere inside the device, more preferably a device that enables controlling both atmosphere and pressure. Preferred examples of such devices include a hot isotropic pressing device (HIP), and a resistance heating vacuum pressurized atmosphere heating furnace.

Preferably, heating is preceded by sufficiently displacing the system with a nitrogen-containing gas flown into the sintering device. The nitrogen-containing gas may be flown after evacuating the system, as required.

Examples of the nitrogen-containing gas used for sintering include a gas containing a nitrogen element, for example, such as a nitrogen gas, an ammonia gas, and a mixed gas of nitrogen and hydrogen. The nitrogen-containing gas may be used either alone or in any combination and any proportions. Preferred as the nitrogen-containing gas is a nitrogen gas containing hydrogen (hydrogen-containing nitrogen gas). For safety, the hydrogen content in the hydrogen-containing nitrogen gas is 4 volume % or less, a range that is out of the explosion limit.

It is also preferable in the present invention to decrease the rate of temperature increase after the sintering.
(Post-Processing Step)

In addition to the foregoing steps, other steps may be performed in the producing method of the present invention, as required. For example, steps such as a pulverization step, a washing step, a classification step, a surface treatment step, and a drying step may be performed after the sintering step, as required.
(Pulverization Step)

The pulverization step may use, for example, pulverizers such as a hammer mill, a roller mill, a ball mill, a jet mill, a ribbon blender, a V-shaped blender, and a Henschel mixer, or may be performed with a mortar and a pestle. Here, in order to prevent destruction of the generated phosphor crystals, and to promote an intended process such as crushing of secondary particles, it is preferable to perform a ball mill process for about 10 minutes to 24 hours in a container made of materials such as alumina, silicon nitride, $ZrO_2$, and glass, using, for example, balls made of the same material used for the container, or urethane balls with an iron core. In this case, a dispersant such as an organic acid, and an alkali phosphate (e.g., hexametaphosphoric acid) may be used in 0.05 mass % to 2 mass %.
(Washing Step)

The washing step may be performed to wash the phosphor surface with, for example, water such as deionized water, organic solvents such as ethanol, and alkaline aqueous solutions such as ammonia water.

In order to improve luminescence characteristics by removing the impurity phase adhering to the phosphor surface such as by removing the flux used, it is also possible to use acidic aqueous solutions containing, for example, inorganic acids such as hydrochloric acid, nitric acid, sulfuric acid, aqua regia, and a mixture of hydrofluoric acid and sulfuric acid; or organic acids such as acetic acid.

These techniques are described in detail in Patent Literatures 1 and 2, and may be performed in the manner described therein.
(Classification Step)

The classification step may be performed, for example, by water sieving, or by using various classification devices such as airflow classification devices and vibration sieves. With dry classification using a nylon mesh, a phosphor with a volume average size of about 10 μm having excellent dispersibility can be obtained. When used in combination with an elutriation process, dry classification using a nylon mesh can produce a phosphor with a volume median size of about 20 μm having excellent dispersibility.

In water sieving or elutriation process, the phosphor particles are typically dispersed in water medium in a concentration of preferably about 0.1 mass % to 10 mass %. In order to prevent any alteration of the phosphor, the pH of water medium is brought to typically 4 or more, preferably 5 or more, and typically 9 or less, preferably 8 or less.

In obtaining volume median phosphor particles such as above, it is preferable from the viewpoint of the balance between procedural efficiency and yield to perform the water sieving and elutriation process in two stages, for example, by first obtaining particles of 50 μm or less, and then obtaining particles of 30 μm or less. Preferably, the sieving process classifies particles as small as typically 1 μm or more, preferably 5 μm or more.
(Drying Step)

The phosphor is dried at about 100° C. to 200° C. after being washed. A dispersion process that prevents dry aggregation (for example, by passing the phosphor through a mesh) also may be performed, as required.
(Vapor Heating Step)

In the production of the phosphor of the present invention, the phosphor after the foregoing steps may be heated by being allowed to stand in the presence of a vapor, preferably in the presence of a water vapor. The heating step can further improve the luminance of the phosphor.

When the vapor heating step is performed, it is preferable that the temperature is typically 50° C. or more, preferably 80° C. or more, more preferably 100° C. or more, and is typically 300° C. or less, preferably 200° C. or less, more preferably 170° C. or less. When the temperature is too low, the effect by the presence of adsorbed water on phosphor surface is not as easily obtainable. An excessively high temperature may roughen the surface of phosphor particles.

Preferably, the humidity (relative humidity) in the vapor heating step is typically 50% or more, preferably 80% or more, particularly preferably 100%. When the humidity is too low, the effect by the presence of adsorbed water on phosphor surface is not as easily obtainable. A liquid phase may coexist with a 100% humidity gas phase, provided that the effect provided by the formation of an adsorbed water layer is obtained.

Preferably, the pressure in the vapor heating step is typically at least ordinary pressure, preferably 0.12 MPa or more, more preferably 0.3 MPa or more, and is typically 10 MPa or less, preferably 1 MPa or less, more preferably 0.6 MPa or less. The effect of the vapor heating step is not as easily obtainable when the pressure is too low. Excessively high pressures require a large-scale processing device, and may cause problems in the safety of the procedures.

The time length in which the phosphor is retained in the presence of a vapor varies with the temperature, humidity, and pressure. Typically, the retention time can be made shorter by increasing temperature, humidity, and pressure. Specifically, it is preferable that the retention time is typically 0.5 hours or more, preferably 1 hour or more, more preferably 1.5 hours or more, and is typically 200 hours or less, preferably 100 hours or less, more preferably 70 hours or less, further preferably 50 hours or less.

A specific example of the vapor heating step that satisfies the foregoing conditions is a method in which the phosphor is placed under high humidity and high pressure in an autoclave. Here, a device, such as a pressure cooker, that can provide the same levels of high temperature and high humidity as the autoclave may be used, in addition to or instead of the autoclave.

The pressure cooker may be, for example, the ESPEC product TPC-412M. This device enables controlling temperature at 105° C. to 162.2° C., humidity at 75 to 100% (depends on the temperature conditions), and pressure at 0.020 MPa to 0.392 MPa (0.2 kg/cm$^2$ to 4.0 kg/cm$^2$).

By performing the vapor heating step on the phosphor placed in an autoclave, a special water layer can be formed in a high-temperature, high-pressure, and high-humidity environment, and water can adsorb to the phosphor surface in a short time period. As an example of specific conditions, the phosphor is placed in an environment of ordinary pressure (0.1 MPa) or higher pressures in the presence of a vapor for at least 0.5 hours.

(Surface Treatment Step)

When the phosphor of the present invention is used to produce a light-emitting unit, the phosphor may be subjected to a surface treatment such as by partially coating the phosphor surface with different materials, as required, so as to further improve weather resistance such as moisture resistance, or to improve the dispersibility of the phosphor-containing portion of the light-emitting unit (described later) against resin.

The surface treatment may be performed before or after the vapor heating step, or may be simultaneously performed with the vapor heating step, provided that the surface treatment does not interfere with the presence of the special adsorbed water in the vapor heating process, or does not have the effect to remove the adsorbed water.

(Phosphor-Containing Composition)

The phosphor-containing composition of the present invention contains the phosphor of the present invention and a liquid medium. When the phosphor of the present invention is used in applications such as light-emitting units, it is preferable to use the phosphor in the form of a dispersion in a liquid medium, specifically in the form of the phosphor-containing composition.

The liquid medium used in the phosphor-containing composition of the present invention may be selected from any liquid media as may be suited for the intended purpose, provided that it has liquid properties under the desired conditions, and can desirably disperse the phosphor of the present invention without causing undesirable effects such as unwanted reactions.

Examples of the liquid medium include silicone resin, epoxy resin, polyvinyl resin, polyethylene resin, polypropylene resin, and polyester resin. The liquid medium may be used either alone or in a combination of two or more in any proportions. The liquid medium may contain an organic solvent.

Specific conditions of the liquid medium, such as amounts used may be appropriately adjusted according to the intended use, and the conditions described in WO2010/114061 in the section under the heading [3. Phosphor-Containing Composition] are also applicable in the present invention.

(Light-Emitting Unit)

The light-emitting unit of the present invention is described below. The light-emitting unit of the present invention is a light-emitting unit that includes a first illuminant, and a second illuminant that emits visible light upon exposure to light from the first illuminant. The second illuminant contains a first phosphor that includes one or more of the phosphor of the present invention.

Specific examples of the first illuminant and of second illuminants different from those using the phosphor of the present invention, and forms of the light-emitting unit are described in WO2010/114061 in the section under the heading [4. Light-Emitting Unit], and these are also applicable in the present invention.

(Embodiment of Light-Emitting Unit)

Specific embodiments of the light-emitting unit of the present invention are described below. It should be noted, however, that the light-emitting unit of the present invention is not limited by the following embodiments, and may be implemented in various modifications within the gist of the present invention.

FIG. 16 is a schematic perspective view of an example of the light-emitting unit of the present invention, representing the positional relationship between the first illuminant provided as an excitation light source, and the second illuminant configured as a phosphor-containing portion with phosphors. The light-emitting unit shown in FIG. 16 includes a phosphor-containing portion (second illuminant) 1, a surface-emitting GaN LD 2 provided as an excitation light source (first illuminant), and a substrate 3. In order to achieve a mutually contacting state, the surfaces of the LD (2) and the phosphor-containing portion (second illuminant) (1) may be brought into contact with each other with an adhesive or other means after separately producing these members, or the phosphor-containing portion (second illuminant) (1) may be deposited (molded) on the emissive surface of the LD (2). The LD (2) and the phosphor-containing portion (second illuminant) (1) can be brought into contact with each other by using either of these methods.

With this configuration, a loss of light quantity due to leakage of light from the excitation light source (first illuminant) occurring upon being reflected at the film surface of the phosphor-containing portion (second illuminant) can be avoided, and the emission efficiency of the unit can be improved as a whole.

FIG. 17A is schematic cross sectional view of an exemplary light-emitting unit of a form commonly called a shell-type, showing an excitation light source (first illuminant) and a phosphor-containing portion (second illuminant) provided therein. The light-emitting unit (4) includes a mount lead 5, an inner lead 6, an excitation light source (first illuminant) 7, a phosphor-containing resin portion 8, a conductive wire 9, and a molded member 10.

FIG. 17B is a schematic cross sectional view of an exemplary light-emitting unit of a form commonly referred to as a surface-mounted light-emitting unit, showing an excitation light source (first illuminant) and a phosphor-containing portion (second illuminant) provided therein. The light-emitting unit shown in the figure includes an excitation light source (first illuminant) 22, a phosphor-containing resin portion (phosphor-containing portion; second illuminant) 23, a frame 24, a conductive wire 25, and electrodes 26 and 27.

(Use of Light-Emitting Unit)

Use of the light-emitting unit of the present invention is not particularly limited, and may typically be used in a variety of fields where light-emitting units are used. With its wide color reproduction range and desirable color rendering properties, the light-emitting unit of the present invention is particularly preferable for use as a lighting device, or a light source of image display devices.

(Lighting Device)

The lighting device of the present invention includes the light-emitting unit of the present invention. When using the light-emitting unit of the present invention for lighting devices, the light-emitting unit exemplified above may be appropriately assembled into a known lighting device. For example, the light-emitting unit (4) may be assembled to provide the surface-emitting lighting device (11) shown in FIG. 18.

FIG. 18 is a cross sectional view schematically representing an embodiment of the lighting device of the present invention. As shown in FIG. 18, the surface-emitting lighting device includes a large number of light-emitting units (13) (each corresponding to the light-emitting unit (4)) on the bottom surface of a rectangular holding casing (12) having opaque inner surfaces (e.g., smooth white surfaces). A power supply, circuits, and other such members (not illustrated) are externally disposed to drive the light-emitting unit (13). For uniform emission, an opaque white diffusion plate (14), such as an acrylic plate, is fixed in a position that corresponds to the cover of the holding casing (12).

Light is emitted upon driving the surface-emitting lighting device (11) and applying a voltage to the excitation light sources (first illuminant) of the light-emitting units (13). Some of the emitted light is absorbed by the phosphor in the phosphor-containing resin portion representing the phosphor-containing portion (second illuminant), and the phosphor emits visible light. The light also becomes mixed with light of other colors such as blue light that was not absorbed by the phosphor. The resulting light with high color rendering properties is then emitted (upward in the figure) through the diffusion plate (14) to produce illumination light of uniform brightness over the plane of the diffusion plate (14) of the holding casing (12).

(Image Display Device)

The image display device of the present invention includes the light-emitting unit of the present invention. When using the light-emitting unit of the present invention as a light source of an image display device, the image display device is not limited to a specific configuration. It is, however, preferable to use the light-emitting unit with a color filter. For example, when the image display device is a color image display device with color liquid crystal display elements, the light-emitting unit may be used as the backlight, and combined with a liquid crystal light shutter coupled to red, green, and blue pixel color filters.

EXAMPLES

The present invention is described below in greater detail using Examples and Comparative Examples. Note, however, that the present invention is not limited by the following Examples, and various changes may be made within the gist of the present invention.

Various evaluations of the phosphor particles in the Examples and Comparative Examples below were performed by using the following techniques.

[Emission Spectrum Measurement Method]

The emission spectrum was measured with a fluorescence measurement apparatus (JASCO Corporation) equipped with a 150-W xenon lamp as the excitation light source, and a multi-channel CCD detector C7041 (Hamamatsu Photonics) as a spectrum measurement device. Light from the excitation light source was passed through a grating spectroscope with a focal length of 10 cm, and the phosphor was irradiated with only the excitation light of 455 nm wavelength through optical fibers.

The generated light from the phosphor upon exposure to the excitation light was dispersed with a grating spectroscope of a 25-cm focal length, and the emission intensity was measured at each wavelength in a 300 nm to 800 nm wavelength range with the spectrum measurement device. An emission spectrum was obtained after signal processing such as sensitivity correction by a personal computer. Measurement was performed with a slit width set at 1 nm on the receiving spectrometer.

The emission peak wavelength and the half width were read from the emission spectrum. The emission peak intensity and the luminance were represented by values relative to the reference peak intensity 100 of LP-B4 [(Ba,Eu)MgAl$_{10}$O$_{17}$] (Kasei Optonix) excited at 365 nm wavelength. Phosphors with higher relative emission peak intensity and luminance values are considered more desirable.

[Reflectance Measurement Method (A)]

For the measurement of reflection spectrum, a 150-W xenon lamp was used as the excitation light source, an integrating sphere was used as a light-collecting device, and an MCPD7000 multi-channel spectrum measurement device (Otsuka Electronics) was used as a spectrum measurement device. First, a material with nearly 100% reflectance R for the excitation light (the Labsphere product Spectralon with 99% reflectance R for 450 nm excitation light) was installed as a standard white reflector, and irradiated with white light from the 150-W xenon lamp through optical fibers after placing a quartz cover glass. The intensity of reflected light at each wavelength in a 380 nm to 780 nm wavelength range was then measured with the spectrum measurement device, and a reflection spectrum was obtained after signal processing such as sensitivity correction by a personal computer.

Thereafter, a phosphor powder to be measured was packed in a cell while making sure that the surface was sufficiently smooth to ensure measurement accuracy, and the intensity of reflected light was measured at each wavelength in the manner described above. A reflection spectrum of the sample was then obtained as percentages of the measured reflection intensities from the standard white reflector.

[Reflectance Measurement Method (B)]

A reflection spectrum was obtained with a visible to ultraviolet autographic spectrophotometer UV-3100PC (Shimadzu Corporation) equipped with a 50-W halogen lamp light source, and a light-collecting integrating sphere. Measurement was performed with a 2.0 nm slit width on the light source side, a 1 nm sampling interval, and a scan speed set on the middle setting.

First, standard white reflectors were set on the subject side and the sample side of a measurement holder in the integrating sphere unit of the spectrophotometer sample chamber, and samples on the subject side and the sample side were irradiated only with light of 380 nm to 780 nm wavelengths dispersed through a grating spectroscope. The intensity of reflected light was then measured, and used for baseline correction by signal processing such as sensitivity correction by a personal computer.

A phosphor powder to be measured was then charged into a fused quartz-equipped measurement cell, gently tapped, and set on a sample holder of the sample side after closing the cap. The intensity of reflected light was then measured as above, and a reflection spectrum of the sample was obtained as percentages of the reflection intensities from the standard white reflector.

Example 1

Source materials were prepared in a nitrogen-filled glove box, using LaN, $Si_3N_4$ (Ube Industries SN-E10), and $CeF_3$ (Pure Chemical Co., Ltd.) in the starting composition ratio shown in Table 1. Specifically, LaN (17.67 g), $Si_3N_4$ (10.81 g), and $CeF_3$ (1.52 g) were weighed, and thoroughly mixed on an alumina mortar. An about 3-g portion from the mixture was then charged into a molybdenum crucible.

For first sintering, the crucible was placed in a resistance heating electric furnace equipped with a temperature adjuster, and heated in the atmospheric pressure under a stream of a mixed gas (96 volume % nitrogen, 4 volume % hydrogen) supplied at 2 liters/min. The rate of temperature increase was 5° C./min from room temperature to 1200° C., and 1° C./min from 1200° C. to 1250° C. The sample was maintained for 4 hours, and allowed to cool to room temperature.

The sample was then transferred to the nitrogen-filled glove box, and sieved into sizes of 100 μm or less. The total amount of sample was then charged into a molybdenum crucible. For primary sintering, the sample was placed in a resistance heating electric furnace equipped with a temperature adjuster, and heated in the atmospheric pressure under a stream of a mixed gas (96 volume % nitrogen, 4 volume % hydrogen) supplied at 2 liters/min. The rate of temperature increase was 5° C./min from room temperature to 1200° C., 1° C./min from 1200° C. to 1400° C., and 2° C./min from 1400° C. to 1525° C. The sample was maintained for 12 hours, and allowed to cool to room temperature.

The sample was then pulverized on an alumina mortar, and impurities were removed by acid washing. The result of the characteristic evaluation of the phosphor is presented in Table 2. FIG. 1 shows the emission spectrum, FIG. 2 shows the reflection spectrum (A), and FIG. 3 shows a SEM image. The emission peak intensity was 64 upon excitation at 455 nm. The evaluation also revealed that reflectance Ra was 89% at 770 nm wavelength.

Example 2

A phosphor synthesis was performed in the same manner as in Example 1, except that the retention temperature for first sintering was changed from 1250° C. to 1300° C. The result of the characteristic evaluation of the phosphor is presented in Table 2. FIG. 1 shows the emission spectrum, FIG. 2 shows the reflection spectrum (A), and FIG. 4 shows a SEM image. The emission peak intensity was 62 upon excitation at 455 nm. The evaluation also revealed that reflectance Ra was 92% at 770 nm wavelength.

Comparative Example 1

A phosphor synthesis was performed in the same manner as in Example 1, except that only the primary sintering was performed without first sintering.

The result of the characteristic evaluation of the phosphor is presented in Table 2. FIG. 1 shows the emission spectrum, FIG. 2 shows the reflection spectrum (A), and FIG. 5 shows a SEM image. The emission peak intensity was 52 upon excitation at 455 nm. The evaluation also revealed that reflectance Ra was 80% at 770 nm wavelength. It was found from these results that LSN phosphors of high reflectance and high emission peak intensity can be obtained when the phosphor is sieved and sintered again after the first sintering.

In regard to conventional LSN phosphors, it is known that the 135 phosphor generates in increased amounts in the presence of oxygen in the source material or in the atmosphere. This raised concerns that oxygen might become mixed with the phosphor upon taking the phosphor out of the sintering furnace, and increase the 135 phosphor and decrease reflectance and emission peak intensity. However, such a decrease in reflectance and other properties due to inclusion of oxygen seemed to have been offset by improvements due to the dispersibility improving effect.

TABLE 1

Starting composition of source materials

| | Starting composition (mol) | | |
|---|---|---|---|
| | LaN | $Si_3N_4$ | $CeF_3$ |
| Ex. 1 | 3.0 | 2.0 | 0.2 |
| Ex. 2 | 3.0 | 2.0 | 0.2 |
| Com. Ex. 1 | 3.0 | 2.0 | 0.2 |

TABLE 2

Results of phosphor characteristic evaluation

| | Emission peak wavelength (nm) | CIE x | CIE y | Relative peak intensity (%) | Reflectance at 770 nm (%) | Particle size D50 (μm) |
|---|---|---|---|---|---|---|
| Ex. 1 | 535 | 0.421 | 0.554 | 64 | 89 | 18 |
| Ex. 2 | 531 | 0.418 | 0.554 | 62 | 92 | 13 |
| Com. Ex. 1 | 536 | 0.424 | 0.553 | 52 | 80 | 37 |

Example 3

A phosphor synthesis was performed in the same manner as in Example 1, except that $GdF_3$ (Pure Chemical Co., Ltd.) was used in the starting composition ratio presented in Table 3. The result of the characteristic evaluation of the phosphor is presented in Table 4. FIG. 6 shows the emission spectrum, and FIG. 7 shows the reflection spectrum (A). The emission peak intensity was 54 upon excitation at 455 nm. The evaluation also revealed that reflectance Ra was 87% at 770 nm wavelength.

Example 4

A phosphor synthesis was performed in the same manner as in Example 1, except that $YF_3$ (Pure Chemical Co., Ltd.) was used in the starting composition ratio presented in Table 3. The result of the characteristic evaluation of the phosphor is presented in Table 4. FIG. 6 shows the emission spectrum, and FIG. 7 shows the reflection spectrum (A). The emission peak intensity was 56 upon excitation at 455 nm. The evaluation also revealed that reflectance Ra was 87% at 770 nm wavelength.

TABLE 3

Starting composition of source materials

Starting composition (mol)

|  | LaN | Si$_3$N$_4$ | CeF$_3$ | GdF$_3$ | YF$_3$ |
|---|---|---|---|---|---|
| Ex. 3 | 2.8 | 2.0 | 0.2 | 0.3 | — |
| Ex. 4 | 2.8 | 2.0 | 0.2 | — | 0.5 |

TABLE 4

Results of phosphor characteristic evaluation

|  | Emission peak wavelength (nm) | CIE x | CIE y | Relative peak intensity (%) | Reflectance at 770 nm (%) | Particle size D50 (µm) |
|---|---|---|---|---|---|---|
| Ex. 3 | 538 | 0.433 | 0.544 | 54 | 87 | 15 |
| Ex. 4 | 553 | 0.469 | 0.519 | 56 | 87 | 28 |

Example 5

Source materials were prepared in a nitrogen-filled glove box, using LaSi (Pure Chemical Co., Ltd.), Si$_3$N$_4$ (Ube Industries SN-E10), and CeF$_3$ (Pure Chemical Co., Ltd.) in the starting composition ratio shown in Table 5.

Specifically, LaSi (2.34 g), Si$_3$N$_4$ (0.66 g), and CeF$_3$ (0.18 g) were weighed, and thoroughly mixed on an alumina mortar. The total amount was then charged into a molybdenum crucible. For first sintering, the crucible was placed in a resistance heating electric furnace equipped with a temperature adjuster, and heated in the atmospheric pressure under a stream of a mixed gas (96 volume % nitrogen, 4 volume % hydrogen) supplied at 2.5 liters/min. The rate of temperature increase was 5° C./min from room temperature to 1200° C., and 1° C./min from 1200° C. to 1300° C. The sample was maintained for 4 hours, and allowed to cool to room temperature. The sample was then transferred to the nitrogen-filled glove box, and sieved into sizes of 100 µm or less.

The total amount of sample was then charged into a molybdenum crucible. For primary sintering, the sample was placed in a resistance heating electric furnace equipped with a temperature adjuster, and heated in the atmospheric pressure under a stream of a mixed gas (96 volume % nitrogen, 4 volume % hydrogen) supplied at 2.5 liters/min. The rate of temperature increase was 5° C./min from room temperature to 1200° C., 1° C./min from 1200° C. to 1400° C., and 2° C./min from 1400° C. to 1525° C. The sample was maintained for 12 hours, and allowed to cool to room temperature.

The sample was then pulverized on an alumina mortar, and impurities were removed by acid washing.

The result of the characteristic evaluation of the phosphor is presented in Table 6. FIG. 8 shows the emission spectrum, and FIG. 9 shows the reflection spectrum (A). The emission peak wavelength was 532 nm upon excitation at 455 nm, the emission peak intensity was 52, and reflectance Ra was 89%.

Measurements of reflectance (B) revealed that reflectance Rb was 69% at the emission peak wavelength of 532 nm, and 84% at 770 nm.

Comparative Example 2

A phosphor synthesis was performed in the same manner as in Example 5, except that only the primary sintering was performed without first sintering.

The result of the characteristic evaluation of the phosphor is presented in Table 6. FIG. 8 shows the emission spectrum, and FIG. 9 shows the reflection spectrum (A). The emission peak wavelength was 532 nm upon excitation at 455 nm, the emission peak intensity was 49, and the reflectance was 87%.

Measurements of reflectance (B) revealed that the reflectance was 64% at the emission peak wavelength of 532 nm, and 82% at 770 nm.

TABLE 5

Starting composition of source materials

Starting composition (mol)

|  | LaSi | Si$_3$N$_4$ | CeF$_3$ |
|---|---|---|---|
| Ex. 5 | 3.0 | 1.0 | 0.2 |
| Com. Ex. 2 | 3.0 | 1.0 | 0.2 |

TABLE 6

Results of phosphor characteristic evaluation

|  | Emission peak wavelength (nm) | CIE x | CIE y | Relative peak intensity (%) | Reflectance at 770 nm (%) | Particle size D50 (µm) |
|---|---|---|---|---|---|---|
| Ex. 5 | 532 | 0.420 | 0.554 | 52 | 89 | 17 |
| Com. Ex. 2 | 533 | 0.423 | 0.551 | 49 | 87 | 22 |

As can be seen in Table 6, the phosphor of the present invention has an excellent relative emission peak intensity.

Example 6

LaSi, CaO (a product from Pure Chemical Co., Ltd.), Si$_3$N$_4$ (SN-E10 from Ube Industries), and CeF$_3$ (a product from Pure Chemical Co., Ltd.) were weighed, and used in the starting composition ratio presented in Table 7. After being weighed, the all source materials were thoroughly mixed in a plastic bag, and passed through a nylon mesh sieve to produce a source material powder. The procedure from the weighing of the source materials to the preparation of the source material powder was performed in a glove box kept under a nitrogen atmosphere containing 1% or less of oxygen.

The source material powder so prepared was charged into a Mo crucible, and set in an electric furnace equipped with a tungsten heater. After evacuating inside of the device, a hydrogen-containing nitrogen gas (nitrogen:hydrogen=96:4 (volume ratio)) was introduced until the pressure reached the atmospheric pressure. The sample was maintained at 1250° C. for 4 hours, and the temperature was lowered before finishing the sintering process. This produced a first sintered powder. The first sintered powder was transferred into the glove box kept under a nitrogen atmosphere containing 1% or less of oxygen, and sieved into sizes of 100 µm or less.

The total amount of sample was then charged into a Mo crucible for primary sintering. The primary sintering was performed in the same manner as in the first sintering. Specifically, the sample was maintained at 1550° C. for 8 hours, and the temperature was lowered before finishing the sintering process and obtaining a phosphor.

The sintered phosphor was passed through a nylon mesh sieve, stirred in 1 N hydrochloric acid for 1 hour, and washed with water. The sample was then dried with a hot air drier at 120° C., and passed through a nylon mesh sieve to obtain a phosphor of Example 6. The result of the characteristic evaluation of the phosphor is presented in Table 8. FIG. 10 shows the emission spectrum, FIG. 11 shows the reflection spectrum (A), and FIG. 14 shows the reflection spectrum (B). The emission peak wavelength was 541 nm upon excitation at 455 nm, the emission peak intensity was 45, and reflectance Ra was 87%. Reflectance Rb was 70% at the emission peak wavelength of 532 nm, and 83% at 770 nm.

Example 7

LaSi, CaO (a product from Pure Chemical Co., Ltd.), $Si_3N_4$ (SN-E10 from Ube Industries), and $CeF_3$ (a product from Pure Chemical Co., Ltd.) were weighed, and used in the starting composition ratio presented in Table 7. After being weighed, the all source materials were thoroughly mixed in a plastic bag, and passed through a nylon mesh sieve to produce a source material powder. The procedure from the weighing of the source materials to the preparation of the source material powder was performed in a glove box kept under a nitrogen atmosphere containing 1% or less of oxygen.

The source material powder so prepared was charged into a Mo crucible, and set in an electric furnace equipped with a tungsten heater. After evacuating inside of the device, a hydrogen-containing nitrogen gas (nitrogen:hydrogen=96:4 (volume ratio)) was introduced until the pressure reached the atmospheric pressure. The sample was maintained at 1175° C. for 4 hours, and the temperature was lowered before finishing the sintering process. This produced a first sintered powder. The first sintered powder was transferred into the glove box kept under a nitrogen atmosphere containing 1% or less of oxygen, and sieved into sizes of 100 μm or less.

The total amount of sample was charged into a Mo crucible. The sample was maintained at 1250° C. for 4 hours, and the temperature was lowered before finishing the sintering process, in the same manner as in the first sintering. This produced a second sintered powder. The second sintered powder was processed in the same manner as in the first sintering.

The total amount of sample was then charged into a Mo crucible for primary sintering. The primary sintering was performed in the same manner as in the first and second sintering. Specifically, the sample was maintained at 1550° C. for 8 hours, and the temperature was lowered before finishing the sintering process and obtaining a phosphor.

The sintered phosphor was passed through a nylon mesh sieve, stirred in 1 N hydrochloric acid for 1 hour, and washed with water. The sample was then dried with a hot air drier at 120° C., and passed through a nylon mesh sieve to obtain a phosphor of Example 7. The result of the characteristic evaluation of the phosphor is presented in Table 8. FIG. 10 shows the emission spectrum, FIG. 11 shows the reflection spectrum (A), and FIG. 14 shows the reflection spectrum (B). The emission peak wavelength was 541 nm upon excitation at 455 nm, the emission peak intensity was 44, and reflectance Ra was 88%. Reflectance Rb was 70% at the emission peak wavelength of 532 nm, and 81% at 770 nm.

TABLE 7

Starting composition of source materials

| | Starting composition (mol) | | | |
|---|---|---|---|---|
| | LaSi | CaO | $Si_3N_4$ | $CeF_3$ |
| Ex. 6 | 2.85 | 0.15 | 0.95 | 0.19 |
| Ex. 7 | 2.85 | 0.15 | 1.00 | 0.19 |

TABLE 8

Results of phosphor characteristic evaluation

| | Emission peak wavelength (nm) | CIE x | CIE y | Relative peak intensity (%) | Reflectance at 770 nm (%) | Particle size D50 (μm) |
|---|---|---|---|---|---|---|
| Ex. 6 | 541 | 0.436 | 0.544 | 45 | 87 | 23 |
| Ex. 7 | 541 | 0.437 | 0.543 | 44 | 88 | 21.8 |

As can be seen in Table 8, the phosphor of the present invention has an excellent emission peak intensity.

Example 8

Preparation of Source Materials

An alloy of La and Si (La:Si molar ratio=1:1), and $Si_3N_4$ were used as source materials, and weighed to make the La:Si molar ratio 3:5.9. $CeF_3$ and $Y_2O_3$ were weighed to make $CeF_3/(alloy+Si_3N_4)$=6.0 wt % and $Y_2O_3/(alloy+Si_3N_4)$=7.6 mass %. Another source material, a $La_3Si_6N_{11}$:Ce phosphor, was weighed in 2 mass % of the total mass of the source materials. After being weighed, the all source materials were thoroughly mixed in a plastic bag, and passed through a nylon mesh sieve to produce a source material powder. The procedure from the weighing of the source materials to the preparation of the source material powder was performed in a glove box kept under a nitrogen atmosphere containing 1% or less of oxygen.

(Sintering)

The source material powder so prepared was charged into a Mo crucible, and set in an electric furnace equipped with a tungsten heater. After evacuating inside of the device, a hydrogen-containing nitrogen gas (nitrogen:hydrogen=96:4 (volume ratio)) was introduced until the pressure reached the atmospheric pressure. The sample was then maintained at 1550° C. for 8 hours, and the temperature was lowered before finishing the sintering process and obtaining a phosphor.

(Washing)

The sintered phosphor was passed through a nylon mesh sieve, stirred in 1 N hydrochloric acid for 1 hour, and washed with water. The sample was then dried with a hot air drier at 120° C., and passed through a nylon mesh sieve to obtain a phosphor of Example 8. The result of the characteristic evaluation of the phosphor is presented in Table 9. FIG. 12 shows the emission spectrum, and FIG. 13 shows the reflection spectrum (A). The emission peak wavelength was 543 nm upon excitation at 455 nm, the emission peak intensity was 46, and reflectance Ra was 90%.

The reflection spectrum (B) is shown in FIG. 15. Reflectance Rb was 73% at the emission peak wavelength of 543 nm, and 86% at 770 nm.

Example 9

The procedure from the weighing to the sintering and washing of the source materials was performed in the same manner as in Example 8.

(Vapor Heating)

The phosphor obtained after the washing step was placed in an autoclave (Hirayama HighClave HG-50), and allowed to stand for 20 hours. The environment inside the autoclave was maintained under saturated water vapor at 135° C. The phosphor was taken out of the autoclave, and dried with a hot air drier at 140° C. for 2 hours to obtain a phosphor of Example 9.

The result of the characteristic evaluation of the phosphor is presented in Table 9. FIG. 12 shows the emission spectrum, and FIG. 13 shows the reflection spectrum (A). The emission peak wavelength was 545 nm upon excitation at 455 nm, the emission peak intensity was 51, and reflectance Ra was 92%.

The reflection spectrum (B) is shown in FIG. 15. Reflectance Rb was 82% at the emission peak wavelength of 545 nm, and 89% at 770 nm.

TABLE 9

Results of phosphor characteristic evaluation

| | Emission peak wavelength (nm) | CIE x | CIE y | Relative peak intensity (%) | Reflectance at 770 nm (%) | Particle size D50 (μm) |
|---|---|---|---|---|---|---|
| Ex. 8 | 543 | 0.449 | 0.534 | 46 | 90 | 15 |
| Ex. 9 | 545 | 0.450 | 0.534 | 51 | 92 | 15 |

As can be seen in Table 9, the phosphor of the present invention has an excellent emission peak intensity.

While the present invention has been described in detail through certain embodiments, it will be understood by a skilled person that various changes and modifications may be made thereto within the spirit and scope of the invention. This application is based on Japanese patent application No. 2013-022444 filed Feb. 7, 2013, the entire contents of which are hereby incorporated by reference.

INDUSTRIAL APPLICABILITY

The present invention enables providing a high-brightness LSN phosphor. The LSN phosphor, when applied to white LEDs, can be suitably used in backlights in lighting and display applications. With the producing method of present invention, a high-brightness phosphor can be produced in a shorter time period than in related art.

REFERENCE SIGNS LIST

1: Phosphor-containing portion (second illuminant)
2: Excitation light source (first illuminant; LD)
3: Substrate
4: Light-emitting unit
5: Mount lead
6: Inner lead
7: Excitation light source (first illuminant)
8: Phosphor-containing resin portion
9: Conductive wire
10: Molded member
11: Surface-emitting lighting device
12: Holding casing
13: Light-emitting unit

The invention claimed is:

1. A nitride phosphor of formula (1):

$$Ln_xSi_yN_n:Z \quad (1),$$

wherein:
Ln is a rare-earth element comprising La and optionally at least one selected from the group consisting of Sc, Y, Pm, Gd, and Lu and excluding Eu, Ce, Pr, Nd, Sm, Tb, Dy, Ho, Er, Tm, and Yb;
Z is an activator comprising at least one selected from the group consisting of Eu, Ce, Cr, Mn, Fe, Pr, Nd, Sm, Tb, Dy, Ho, Er, Tm, and Yb;
x satisfies $2.7 \leq x \leq 3.3$;
y satisfies $5.4 \leq y \leq 6.6$; and
n satisfies $10 \leq n \leq 12$, and
wherein the nitride phosphor has an x value of less than 0.43 in luminescent color coordinates (x, y) upon being excited with excitation light of 455 nm, and a reflectance Ra of 89% or more at 770 nm.

2. The nitride phosphor of claim 1, wherein Ln comprises 80 mol % or more of La, based on a total amount of Ln.

3. The nitride phosphor of claim 1, wherein Ln comprises 95 mol % or more of La, based on a total amount of Ln.

4. A phosphor-containing composition comprising the nitride phosphor of claim 1, and a liquid medium.

5. A light-emitting unit comprising a first illuminant, and a second illuminant that emits visible light upon exposure to light from the first illuminant,
wherein the second illuminant contains one or more of the nitride phosphor of claim 1 as a first phosphor.

6. An image display device comprising the light-emitting unit of claim 5 as a light source.

7. A lighting device comprising the light-emitting unit of claim 5 as a light source.

8. A nitride phosphor of formula (1):

$$Ln_xSi_yN_n:Z \quad (1),$$

wherein:
Ln is a rare-earth element comprising La and excluding Eu, Ce, Pr, Nd, Sm, Tb, Dy, Ho, Er, Tm, and Yb;
Z is an activator comprising at least one selected from the group consisting of Eu, Ce, Cr, Mn, Fe, Pr, Nd, Sm, Tb, Dy, Ho, Er, Tm, and Yb;
x satisfies $2.7 \leq x \leq 3.3$;
y satisfies $5.4 \leq y \leq 6.6$; and
n satisfies $10 \leq n \leq 12$, and
wherein the nitride phosphor has an x value of 0.43 or more in luminescent color coordinates (x, y) upon being excited with excitation light of 455 nm, and a reflectance Ra of 87% or more at 770 nm.

9. The nitride phosphor of claim 8, wherein Ln comprises 80 mol % or more of La, based on a total amount of Ln.

10. The nitride phosphor of claim 8, wherein Ln comprises La and at least one selected from the group consisting of Sc, Y, Pm, Gd, and Lu.

11. The nitride phosphor of claim 8, wherein Ln comprises 80 mol % or more of La, based on a total amount of Ln, and selected from the group consisting of Sc, Y, Pm, Gd, and Lu.

12. The nitride phosphor of claim 8, wherein Ln comprises La and at least one selected from the group consisting of Y and Gd.

13. A phosphor-containing composition comprising the nitride phosphor of claim 8, and a liquid medium.

14. A light-emitting unit comprising a first illuminant, and a second illuminant that emits visible light upon exposure to light from the first illuminant,
  wherein the second illuminant contains one or more of the nitride phosphor of claim 8 as a first phosphor.

15. An image display device comprising the light-emitting unit of claim 14 as a light source.

16. A lighting device comprising the light-emitting unit of claim 14 as a light source.

17. A method for producing a nitride phosphor of formula (1):

$$Ln_xSi_yN_n:Z \qquad (1),$$

wherein:
Ln is a rare-earth element excluding Eu, Ce, Pr, Nd, Sm, Tb, Dy, Ho, Er, Tm, and Yb;
Z is an activator comprising at least one selected from the group consisting of Eu, Ce, Cr, Mn, Fe, Pr, Nd, Sm, Tb, Dy, Ho, Er, Tm, and Yb;
x satisfies $2.7 \leq x \leq 3.3$;
y satisfies $5.4 \leq y \leq 6.6$; and
n satisfies $10 \leq n \leq 12$,
the method comprising:
  a plurality of sintering steps that includes a first sintering step in which a sintering temperature is from 1100° C. to 1400° C., and a second sintering step in which source materials after the first sintering are redispersed, and subjected to a secondary sintering at a temperature between the first sintering temperature and 1900° C.

* * * * *